(12) United States Patent
Fukuda et al.

(10) Patent No.: US 8,475,680 B2
(45) Date of Patent: Jul. 2, 2013

(54) LUMINESCENT MATERIAL AND LIGHT-EMITTING DEVICE

(75) Inventors: Yumi Fukuda, Tokyo (JP); Masaaki Tamatani, Fujisawa (JP); Katsuko Tamatani, legal representative, Fujisawa (JP); Hironori Asai, Yokohama (JP); Ryosuke Hiramatsu, Kawasaki (JP); Junichi Tatami, Yokohama (JP); Katsutoshi Komeya, Yokohama (JP); Toru Wakihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1190 days.

(21) Appl. No.: 12/207,771

(22) Filed: Sep. 10, 2008

(65) Prior Publication Data

US 2009/0096361 A1    Apr. 16, 2009

Related U.S. Application Data

(63) Continuation of application No. PCT/JP2007/054676, filed on Mar. 9, 2007.

(30) Foreign Application Priority Data

Mar. 10, 2006  (JP) ................................. 2006-065603

(51) Int. Cl.
C09K 11/66 (2006.01)
C09K 11/08 (2006.01)
C09K 11/02 (2006.01)
C09K 11/77 (2006.01)

(52) U.S. Cl.
USPC .............................. 252/301.4 F; 252/301.4 R

(58) Field of Classification Search
USPC ..................... 252/301.4, 301.4 FR, 301.4 RF
See application file for complete search history.

(56) References Cited

U.S. PATENT DOCUMENTS

| 7,414,272 B2 | 8/2008 | Hiramatsu et al. | |
|---|---|---|---|
| 7,443,094 B2 * | 10/2008 | Sakane et al. | 313/503 |
| 7,524,437 B2 * | 4/2009 | Sakane et al. | 252/301.4 F |
| 2003/0094893 A1 | 5/2003 | Ellens et al. | |
| 2005/0230689 A1 | 10/2005 | Setlur et al. | |
| 2006/0290269 A1 | 12/2006 | Fukuda et al. | |
| 2008/0303409 A1 | 12/2008 | Hirosaki | |
| 2010/0079058 A1 | 4/2010 | Schmidt et al. | |

FOREIGN PATENT DOCUMENTS

| EP | 1 777 280 A1 | 4/2007 |
|---|---|---|
| JP | 60-206889 | 10/1985 |
| JP | 2004-67837 | 3/2004 |
| JP | 2005-36038 | 2/2005 |
| JP | 2005-048105 | 2/2005 |
| JP | 2005-255895 | 9/2005 |
| JP | 2006-8721 | 1/2006 |
| JP | 4762248 B2 | 8/2011 |
| WO | WO 2005/049763 A1 | 6/2005 |
| WO | WO 2006/003961 A1 | 1/2006 |
| WO | WO 2006/033417 A1 | 3/2006 |
| WO | WO 2006/033418 A1 | 3/2006 |
| WO | WO 2006/050232 A1 | 5/2006 |
| WO | WO 2006/061778 A1 | 6/2006 |
| WO | WO 2006/072918 A1 | 7/2006 |
| WO | WO 2006/073141 A1 | 7/2006 |
| WO | WO 2006/080539 A1 | 8/2006 |
| WO | WO 2006/093298 A1 | 9/2006 |
| WO | WO 2006/126567 A1 | 11/2006 |
| WO | WO 2007/004138 A2 | 1/2007 |
| WO | WO 2007/004138 A3 | 1/2007 |

OTHER PUBLICATIONS

U.S. Appl. No. 12/869,279, filed Aug. 26, 2010, Fukuda, et al.
U.S. Appl. No. 12/875,507, filed Sep. 3, 2010, Okada, et al.
U.S. Appl. No. 13/239,578, filed Sep. 22, 2011, Kato et al.
U.S. Appl. No. 12/606,279, filed Oct. 27, 2009, Fukuda, et al.
U.S. Appl. No. 12/504,180, filed Jul. 16, 2009, Fukuda, et al.
U.S. Appl. No. 13/218,808, filed Aug. 26, 2011, Kato, et al.
U.S. Appl. No. 13/221,042, filed Aug. 30, 2011, Okada, et al.
U.S. Appl. No. 13/214,572, filed Aug. 22, 2011, Mitsuishi, et al.
U.S. Appl. No. 13/214,410, filed Aug. 22, 2011, Mitsuishi, et al.
U.S. Appl. No. 13/214,608, filed Aug. 22, 2011, Mitsuishi, et al.
U.S. Appl. No. 13/214,444, filed Aug. 22, 2011, Mitsuishi, et al.
U.S. Appl. No. 13/214,377, filed Aug. 22, 2011, Mitsuishi, et al.
U.S. Appl. No. 13/601,219, filed Aug. 31, 2012, Fukuda, et al.
U.S. Appl. No. 13/601,433, filed Aug. 31, 2012, Mitsuishi, et al.
U.S. Appl. No. 13/601,070, filed Aug. 31, 2012, Albessard, et al.
U.S. Appl. No. 13/034,137, filed Feb. 24, 2011, Mitsuishi, et al.
U.S. Appl. No. 13/033,917, filed Feb. 24, 2011, Mitsuishi, et al.
U.S. Appl. No. 13/033,954, filed Feb. 24, 2011, Mitsuishi, et al.
U.S. Appl. No. 13/034,120, filed Feb. 24, 2011, Mitsuishi, et al.
U.S. Appl. No. 13/033,960, filed Feb. 24, 2011, Mitsuishi, et al.
U.S. Appl. No. 13/036,410, filed Feb. 28, 2011, Matsuda, et al.
U.S. Appl. No. 13/037,635, filed Mar. 1, 2011, Okada, et al.
U.S. Appl. No. 12/211,969, filed Sep. 17, 2008, Fukuda, et al.
Extended European Search Report issued Aug. 2, 2011, in Patent Application No. 10014287.6.
Japanese Office Action issued Sep. 27, 2011 in patent application No. 2011-176115 with English translation.
B.L. Abrams et al., "Electron beam-induced degradation of zinc sulfide-based phosphors", Surface Science 451 (2000) 174-181.
N. Hirosaki et al., Extended Abstracts (The 53$^{rd}$ Spring Meeting, 2006); The Japan Society of Applied Physics and Related Societies, 25p-ZR-11; JSAP Catalog Number: AP 0611103-03.
Extended European Search Report issued on Oct. 28, 2010, in Application No. 07738161.4.
Office Action issued Aug. 21, 2012 in Japanese Patent Application No. 2010-246179 (with English-language translation).

* cited by examiner

*Primary Examiner* — Carol M Koslow
*Assistant Examiner* — Matthew E Hoban
(74) *Attorney, Agent, or Firm* — Oblon, Spivak, McClelland, Maier & Neustadt, L.L.P.

(57) ABSTRACT

A luminescent material which is featured in that it exhibits an emission peak at a wavelength ranging from 490 to 580 nm as it is excited by light having a wavelength ranging from 250 to 500 nm and that it has a composition represented by the following general formula (2):

$$(M_{1-x}R_x)_{a2}AlSi_{b2}O_{c2}N_{d2} \quad (2)$$

(In the general formula (2), M is at least one metallic element excluding Si and Al, R is a luminescence center element, and x, a2, b2, c2 and d2 satisfy the following relationships:
$0 < x \leq 1$, $0.93 < a2 < 1.3$, $4.0 < b2 < 5.8$
$0.6 < c2 < 1$, $6 < d2 < 11$).

7 Claims, 12 Drawing Sheets

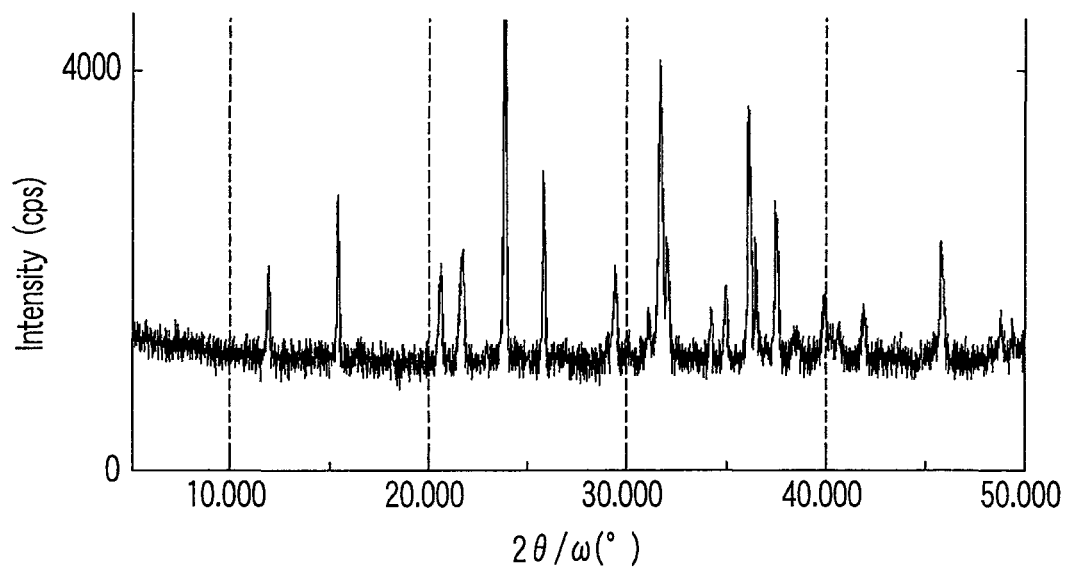
F I G. 1
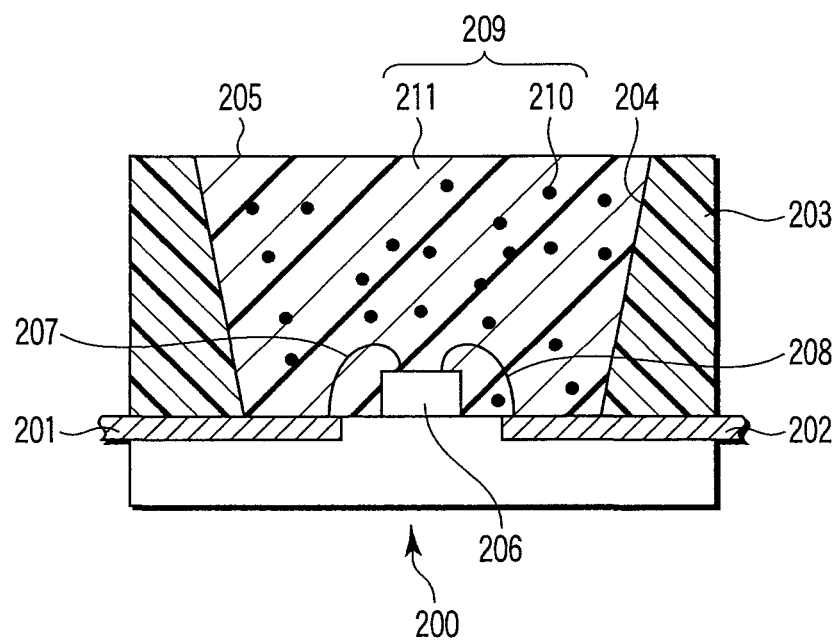
F I G. 2

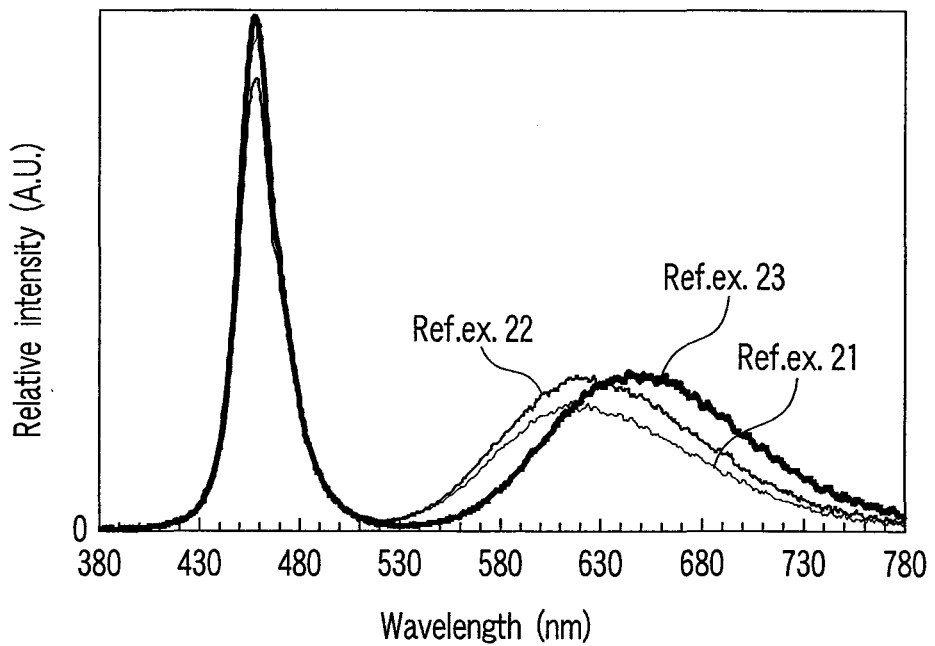
F I G. 9
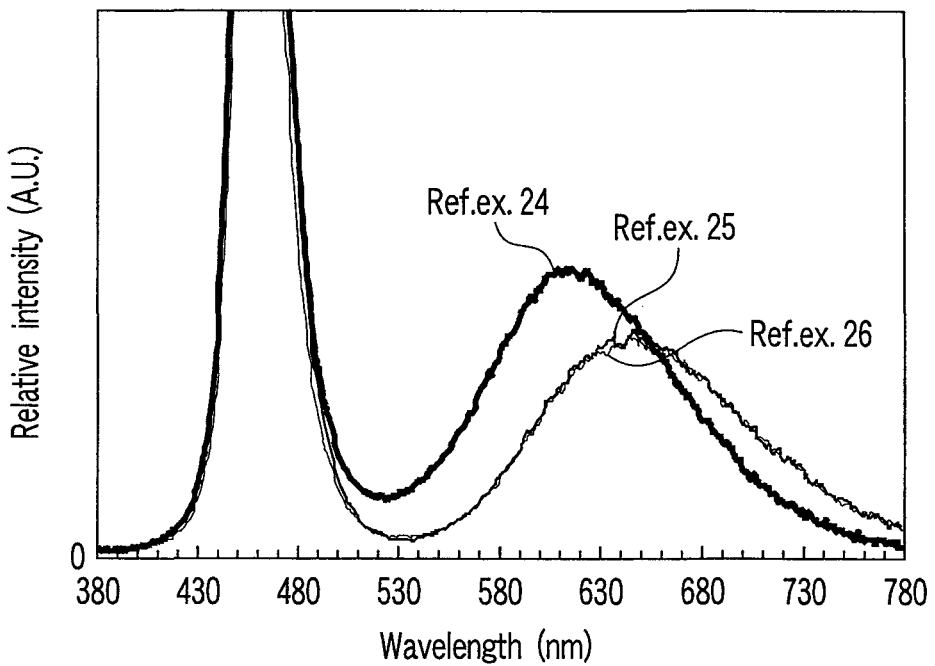
F I G. 10

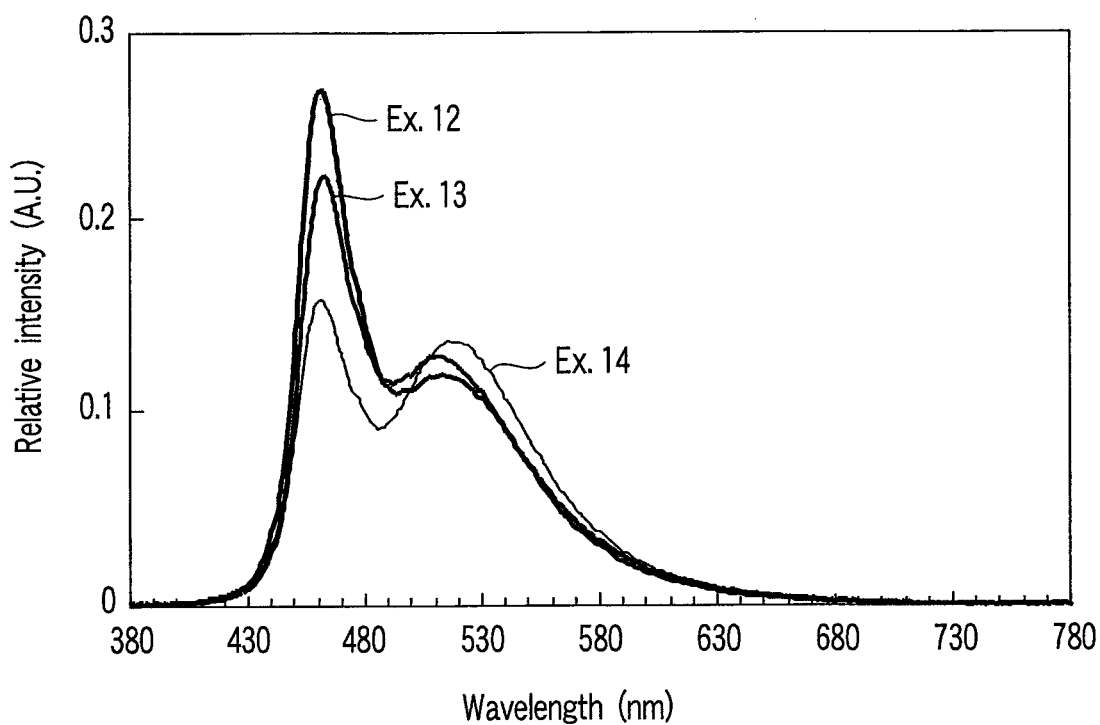
F I G. 17
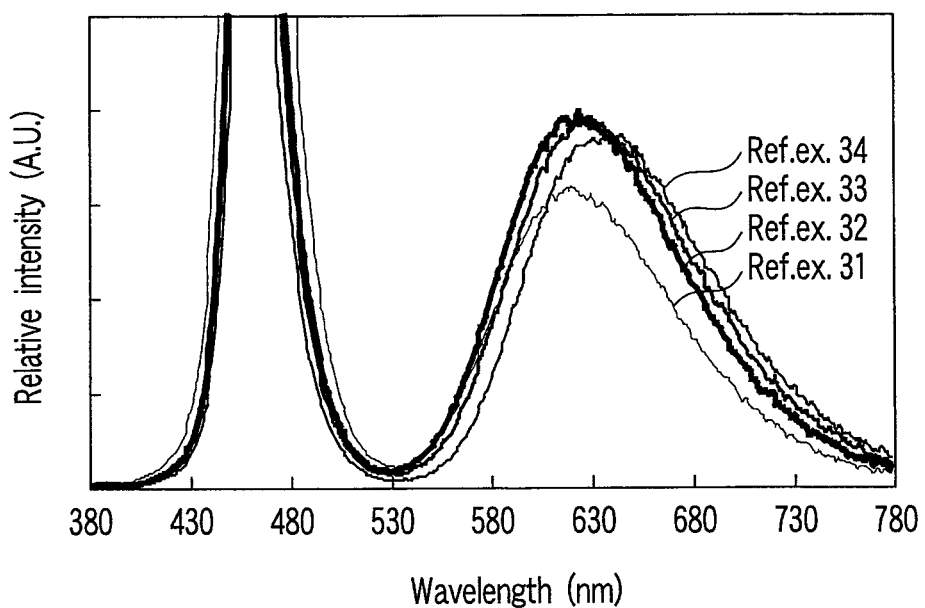
F I G. 18

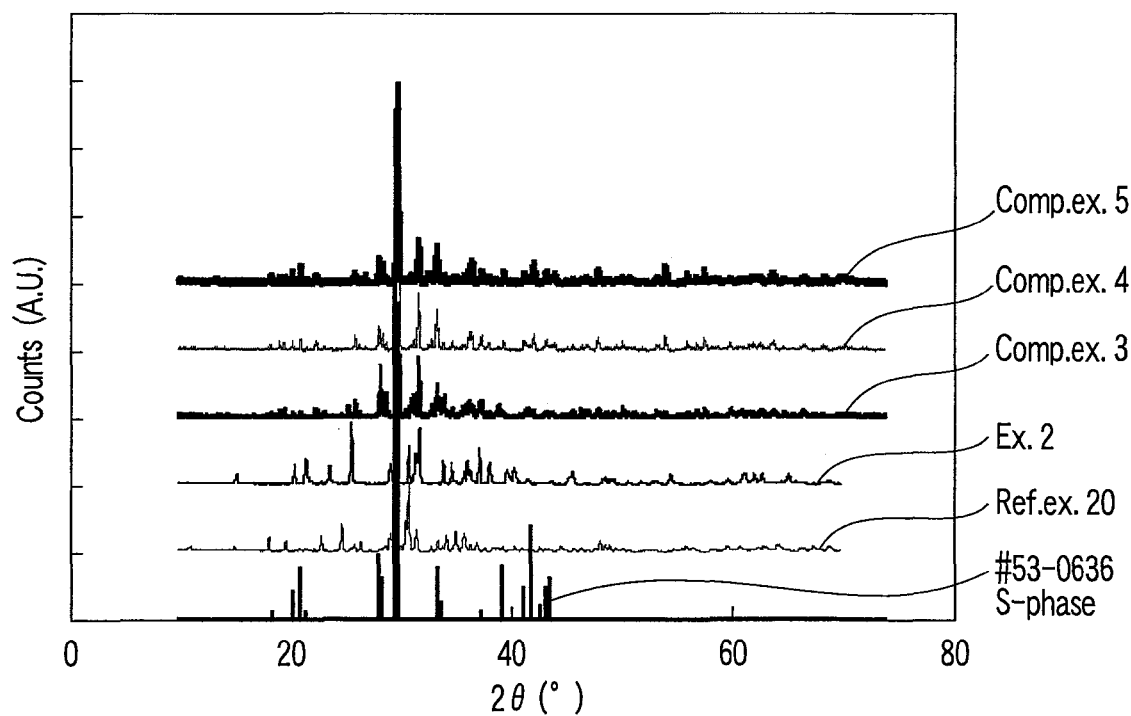
F I G. 21
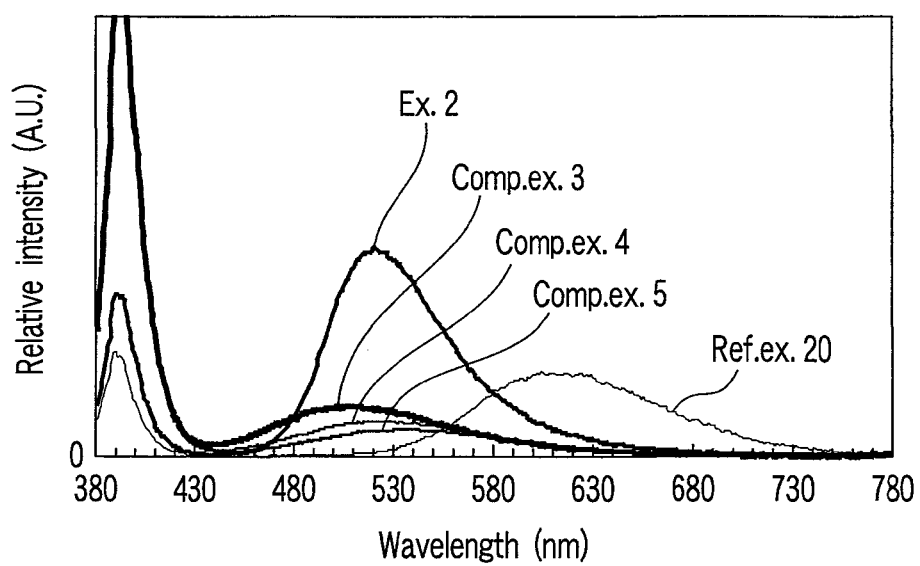
F I G. 22

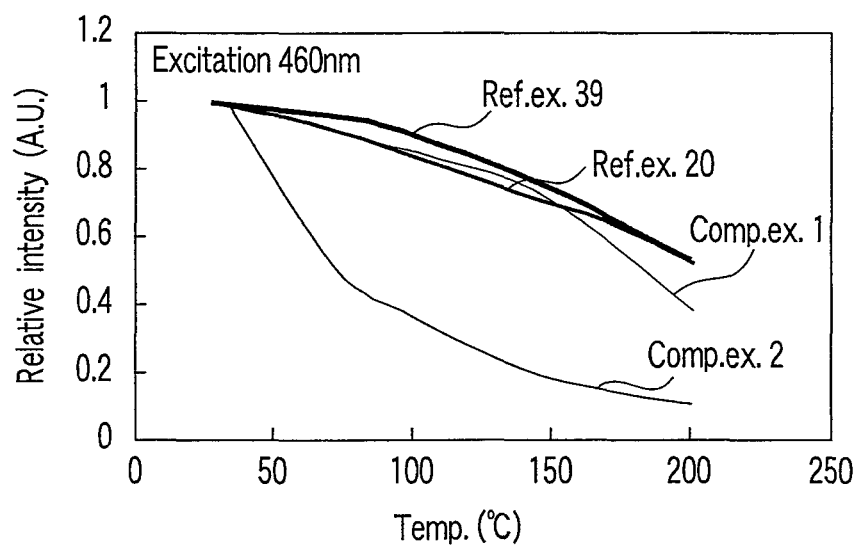
F I G. 23
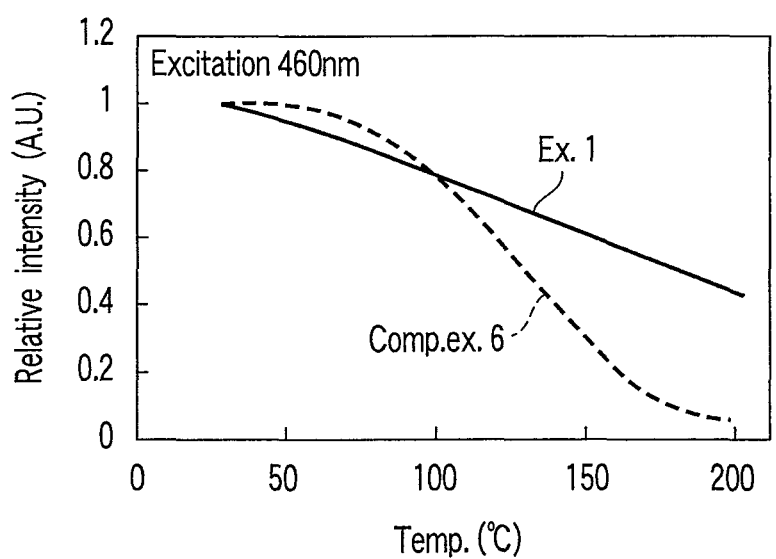
F I G. 24

LUMINESCENT MATERIAL AND LIGHT-EMITTING DEVICE

CROSS REFERENCE TO RELATED APPLICATIONS

This is a Continuation Application of PCT Application No. PCT/JP2007/054676, filed Mar. 9, 2007, which was published under PCT Article 21(2) in Japanese.

This application is based upon and claims the benefit of priority from prior Japanese Patent Application No. 2006-065603, filed Mar. 10, 2006, the entire contents of which are incorporated herein by reference.

BACKGROUND OF THE INVENTION

1. Field of the Invention

This invention relates to a luminescent material to be employed in a light-emitting device and to a light-emitting device.

2. Description of the Related Art

LED lamps utilizing light-emitting diodes are now employed in various kinds of display devices such as portable devices, PC peripherals, OA equipment, various kinds of switches, light sources for backlights, and display panels. A high-load LED is known to become hot when energized, thus increasing the temperature of the luminescent material to about 100 to 200° C. and, due to this rise in temperature, the emission intensity of the luminescent material deteriorates. It is desirable that the luminescent material barely deteriorates even when caused to rise in temperature.

As the luminescent material which is capable of green emission as it is excited by blue light and which is designed to be employed in the aforementioned LED lamp, there is known an Eu-activated β-sialon luminescent material. This luminescent material is known to exhibit excellent emission efficiency as it is excited with light having a wavelength of 450 nm. Namely, when this luminescent material is excited with light having a wavelength of 450 nm, it exhibits an absorption coefficient of 65%, an internal quantum efficiency of 53% and an emission efficiency of 35%.

It should be noted, with regard to the development of a flat panel display device, that although much vigorous effort has been made in the development of a plasma display panel (PDP) and liquid crystal display (LCD), a field-emission-type display is expected to be more advantageous than the PDP and the LCD in that it is capable of providing a clearer image.

This field-emission-type display has a screen in which red, green and blue luminescent materials are arrayed and with a cathode which is disposed to face the screen at smaller intervals than those of the CRT. The cathode is provided with a plurality of electron sources as an emitter element, enabling the electron sources to emit an electron in conformity with a potential difference between the electron sources and the gate electrodes disposed near the electron sources. The electron thus emitted is accelerated by an anode voltage (accelerating voltage) of the luminescent materials side and enabled to impinge against the luminescent materials, thereby enabling the luminescent materials to emit light.

As the luminescent materials to be employed in the field-emission-type display constructed as described above, it is required that the luminescent materials are capable of exhibiting a sufficiently high luminous efficiency, so that even when the luminescent materials are saturated with electric charge as excited by a high current density, they are still capable of exhibiting a sufficiently high luminous efficiency. The conventional sulfide luminescent materials (ZnS:Cu, ZnS:Ag) which have been employed as a luminescent material for CRT may be a prospective candidate as meeting the aforementioned requirements. It is however reported that the sulfide luminescent materials such as ZnS are subject to decomposition under the conditions where a low energy cathode-ray display screen is excited. The decomposed matters thus generated may badly degrade a heat filament which is designed to emit electron beam. In particular, ZnS-based blue luminescent materials that have been conventionally employed are more liable to suffer from luminance deterioration as compared with red luminescent materials and green luminescent materials, thereby raising the problem that the display color of a color picture plane changes with time.

BRIEF SUMMARY OF THE INVENTION

An object of the present invention is to provide a luminescent material which is excellent in temperature characteristics.

A luminescent material according to one aspect of the present invention is featured in that it exhibits a light emission peak in a wavelength ranging from 490 to 580 nm when excited with light having a wavelength ranging from 250 to 500 nm and that it has a composition represented by the following general formula (2):

$$(M_{1-x}R_x)_{a2}AlSi_{b2}O_{c2}N_{d2} \qquad (2)$$

(In the general formula (2), M is at least one metallic element excluding Si and Al; R is a luminescence center element; and x, a2, b2, c2 and d2 satisfy following relationships:

$0 < x \leq 1$, $0.93 < a2 < 1.3$, $4.0 < b2 < 5.8$
$0.6 < c2 < 1$, $6 < d2 < 11$).

A luminescent material according to another aspect of the present invention is featured in that it exhibits a light emission peak in a wavelength ranging from 490 to 580 nm when excited with light having a wavelength ranging from 250 to 500 nm and that it has a composition represented by the following general formula (2):

$$(M_{1-x}R_x)_{a2}AlSi_{b2}2O_{c2}2N_{d2} \qquad (2)$$

(In the general formula (2), M is at least one metallic element excluding Si and Al; R is a luminescence center element; and x, a2, b2, c2 and d2 satisfy following relationships:

$0 < x \leq 1$, $0.94 < a2 < 1.1$, $4.1 < b2 < 4.7$
$0.7 < c2 < 0.85$, $7 < d2 < 9$).

BRIEF DESCRIPTION OF THE SEVERAL VIEWS OF THE DRAWING

FIG. 1 is an XRD profile of a luminescent material according to one embodiment;

FIG. 2 is a cross-sectional view schematically illustrating the structure of a light-emitting device according to one embodiment;

FIG. 9 are emission spectra obtained as the luminescent materials of Reference Examples 21-23 were excited by light having a wavelength of 457 nm;

FIG. 10 are emission spectra obtained as the luminescent materials of Reference Examples 24-26 were excited by light having a wavelength of 457 nm;

FIG. 17 are emission spectra obtained as the luminescent materials of Examples 12-14;

FIG. 18 are emission spectra obtained as the luminescent materials of Reference Examples 31-34 were excited by light having a wavelength of 457 nm;

FIG. 21 are XRD profiles of the luminescent materials of Comparative Examples 3-5, Reference Example 20 and Example 2;

FIG. 22 are emission spectra obtained as the luminescent materials of Comparative Examples 3-5, Reference Example 20 and Example 2 were excited by light having a wavelength of 390 nm;

FIG. 23 is a graph illustrating the temperature characteristics, relative to emission intensity, of the luminescent materials of Reference Examples 20 and 39 and Comparative Examples 1 and 2 as they were excited by light having a wavelength of 461 nm; and FIG. 24 is a graph illustrating the temperature characteristics, relative to emission intensity, of the luminescent materials of Examples 1 and Comparative Example 6 as they were excited by light having a wavelength of 461 nm.

DETAILED DESCRIPTION OF THE INVENTION

Figure 3:
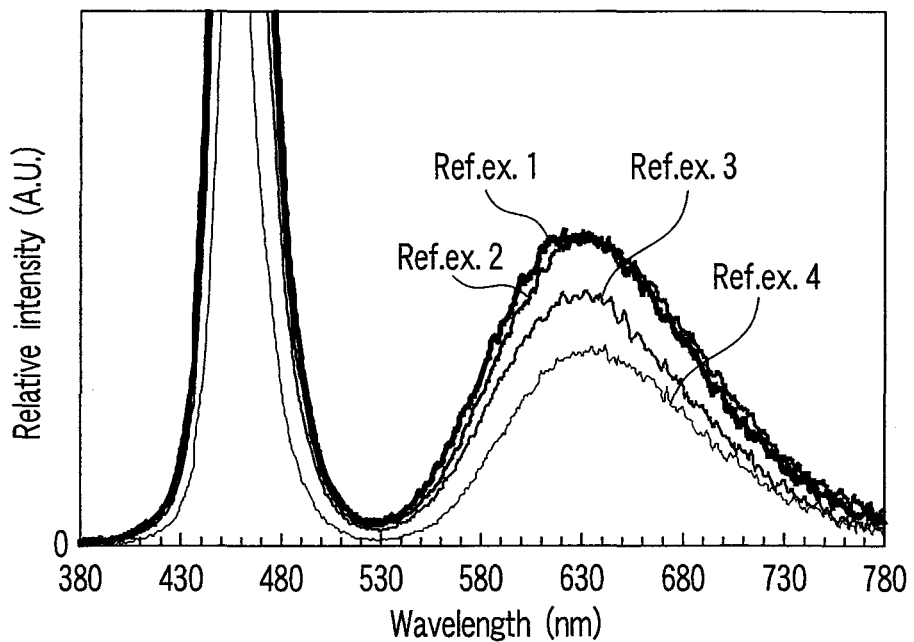
FIG. 3 are emission spectra obtained as the luminescent materials of Reference Examples 1-4 were excited by light having a wavelength of 457 nm.

Next, various embodiments of the present invention will be explained.

It has been found out by the present inventors that it is possible to obtain a luminescent material which is excellent in temperature characteristics through the addition of a luminescence center element to a sialon-based compound having a specific composition. This sialon-based compound in this specification can be represented by the following composition formula (A).

$$MAlSiON \tag{A}$$

In this composition formula (A), M is at least one metallic element excluding Si and Al. More specifically, the metallic element may be selected from alkaline earth metals such as Mg, Ca, Sr, Ba, etc.; rare earth elements such as Y, Gd, La, Lu, Sc, etc.; and alkaline metals such as Li, Na, K, etc. Further, B, Ga, In, Ge, etc., may be included in the aforementioned composition as the metallic element M.

In the creation of the luminescent material according to this embodiment, at least part of the metallic element M in the sialon-based compound is replaced by a luminescence center element and the constituent elements of the composition are respectively regulated to a predetermined range. The luminescent material according to this embodiment can be considered as represented by the following composition formula (B) wherein the constituent elements thereof are respectively regulated to a predetermined range.

$$(M_{1-x}R_x)_a AlSi_b O_c N_d \tag{B}$$

As the luminescence center element R, it can be selected, for example, from Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi and Fe. In view of the variability of emission wavelength, etc., it is more preferable to employ at least one selected from Eu and Mn.

It is desirable that the luminescence center element R is substituted for at least 0.1 mole % of the metallic element M. If the amount of substitution is less than 0.1 mole %, it may become difficult to obtain sufficient light-emitting effects. Although the luminescence center element R may be employed to substitute all of the metallic element M, as long as the amount of substitution is limited to less than 50 mole %, it is possible to suppress most effectively the deterioration (concentration quenching) of emission efficiency.

A luminescent material according to one embodiment is featured in that it exhibits an emission peak at a wavelength ranging from 490 to 580 nm as it is excited by light having a wavelength ranging from 250 to 500 nm and that it has a composition represented by the following general formula (2):

$$(M_{1-x}R_x)_{a2} AlSi_{b2} O_{c2} N_{d2} \tag{2}$$

(In the general formula (2), M is at least one metallic element excluding Si and Al; R is a luminescence center element; and x, a2, b2, c2 and d2 satisfy following relationships):

$0 < x \leq 1$, $0.93 < a2 < 1.3$, $4.0 < b2 < 5.8$
$0.6 < c2 < 1$, $6 < d2 < 11$).

The luminescent material having the composition represented by the aforementioned general formula (2) may be classified as emitting a light zone ranging in color from green to yellowish green when excited with light having a wavelength ranging from 250 to 500 nm.

When an alkaline earth metal element is included, as the metallic element M, in the aforementioned general formula (2), the luminescent material to be obtained is enabled to exhibit an X-ray diffraction profile as schematically shown in FIG. 1 for example in the X-ray diffraction where CuKα characteristic X-rays (wavelength: 1.54056 Å) is employed. As shown in FIG. 1, the luminescent material having the composition represented by the aforementioned general formula (2) contains one component concurrently indicating diffraction peaks at diffraction angles (2θ) of 11.81-11.85, 15.34-15.38, 20.40-20.47 and 23.74-23.86°.

Since this luminescent material is formulated to have a composition wherein the contents of constituent elements thereof are respectively confined to a specific range, this luminescent material is enabled to exhibit excellent temperature characteristics.

The luminescent material according to this embodiment can be synthesized using, as starting materials, the carbonates, nitrides or oxides of the metallic element M; carbides of cyanamide; the nitrides, oxides or carbide of Al or Si; and the oxides, nitrides or carbonates of the luminescence center element R. More specifically, if it is desired to obtain a luminescent material containing Eu as a luminescence center element R, $SrCO_3$, AlN, $Si_3N_4$ and $Eu_2O_3$ can be employed as starting materials. More specifically, these starting materials are weighed and mixed together so as to obtain a mixed powder having a desired composition, which is then sintered to obtain the aimed luminescent material. In the step of mixing these starting materials, it is possible to employ a ball mill in which these starting materials are mixed together with, for example, dehydrated isopropanol (IPA) for 2 to 72 hours. It is also possible to employ, other than the aforementioned IPA, other organic solvent such as ethanol or an aqueous solution. The mixing of these starting materials may be performed by either dry mixing in a mortar or wet mixing methods.

The IPA is then volatilized and removed by room temperature drying or heat-drying using a mantle heater. Thereafter, the resultant mixture is allowed to dry overnight in air atmosphere at a temperature ranging from 0 to 40° C. and then ground in a mortar and charged in a carbon crucible. The drying of the mixture may be performed using a hot plate as desired. Further, as the material of the crucible, it may be boron nitride, silicon nitride, silicon carbide, aluminum nitride, sialon, aluminum oxide, molybdenum or tungsten.

The mixture in the crucible is then subjected to sintering for a predetermined period of time to obtain a luminescent material having a predetermined composition. The pressure in the sintering step should preferably be higher than atmospheric pressure. In order to suppress the decomposition of silicon nitride at high temperatures, the pressure in this sintering step should preferably be 5 atm or more. As for the sintering temperature, it should preferably be confined within the range of 1500 to 2000° C., more preferably the range of 1800 to 2000° C. If the sintering temperature is lower than 1500° C., it may become difficult to create the sialon. On the other hand, if the sintering temperature is higher than 2000° C., the materials or products may sublime. Further, since AlN employed as a raw material is vulnerable to oxidation, the sintering should preferably be performed in a nitrogen atmosphere. Alternatively, the sintering may be performed in a mixed gas atmosphere consisting of nitrogen and hydrogen.

The powder that has been sintered is optionally subjected to post treatments such as washing to obtain a luminescent material according to one embodiment. The washing can be performed by washing with pure water or by acid washing for example. It should be noted that, as for the conventional nitride luminescent material, there is also known $CaAlSiN_3$: Eu, which can be synthesized using $Ca_3N_2$, etc., as raw materials. Since this raw material is anaerobic, the weighing and mixing of raw materials on the occasion of the synthesis of luminescent material are required to be performed in an environment which is sealed off from air atmosphere, e.g., in a glove box. Whereas, in the case of synthesizing a luminescent material according to this embodiment however, the weighing and mixing of raw materials can be performed in air atmosphere. The reason for this can be ascribed to the fact that the reactivity in air atmosphere of the raw materials of luminescent material according to this embodiment is lower than that of the aforementioned $Ca_3N_2$. Therefore, the luminescent material according to this embodiment can be manufactured in a very simple process, thereby making it possible to remarkably reduce the manufacturing cost.

The luminescent material according to this embodiment can be applied to the manufacture of a white LED. More specifically, it is possible to obtain white light by suitably combining plural kinds of luminescent materials. For example, plural kinds of luminescent materials respectively emitting red, yellow (or green) or blue light as they are irradiated with ultraviolet rays can be combined to obtain white light. Alternatively, it is also possible to combine plural kinds of luminescent materials respectively emitting yellow or red light (a luminescent material which is capable of emitting red light may be omitted if required) as they are irradiated with blue light.

In the light-emitting device shown in FIG. 2, a resin stem 200 comprises a lead 201 and a lead 202 both forming a lead frame, and a resin part 203 which is formed integral with these leads 201 and 202. This resin part 203 is provided with a recess 205 having an upper opening which is made larger in width than that of the bottom thereof and with a reflection surface 204 on the sidewall of recess 205.

A light-emitting chip 206 is mounted at a central portion of nearly circular bottom of the recess 205 by silver paste, etc. As for the light-emitting chip 206, it is possible to employ, for example, a light-emitting diode, a laser diode, etc. Alternatively, it is also possible to employ those which are capable of emitting ultraviolet rays. Namely, there is not any particular limitation with respect to the kinds of the light-emitting chip 206. Thus, it is possible to employ, other than the ultraviolet-ray-emitting chip, a chip which is capable of emitting blue, bluish purple, or near-ultraviolet light. For example, it is possible to employ a semiconductor light-emitting element such as GaN, etc. The electrodes (not shown) of the light-emitting chip 206 are electrically connected, through bonding wires 207 and 208 made of gold, etc., with the lead 201 and the lead 202, respectively. It should be noted that the arrangement of these leads 201 and 202 can be optionally modified.

A luminous layer 209 is placed in the recess 205 of resin part 203. This luminous layer 209 can be formed by dispersing or sedimenting a luminescent material 210 according to one embodiment in a resin layer 211 made of silicone resin for example at a concentration ranging from 5 to 50% by weight. In the luminescent material according to this embodiment, a nitride which is high in covalent boding property is employed as a matrix. Because of this, the luminescent material is rendered hydrophobic and hence very excellent in affinity with the resin. Therefore, it is possible to effectively suppress the scattering of light at the interface of resin and luminescent material, and the light extraction efficiency is improved.

As the light-emitting chip 206, it is possible to employ a flip-chip where an n-type electrode and a p-type electrode are positioned on the same plane. In this case, it is possible to overcome the problems originating from wire such as the cut-off or peeling of wire and the absorption of light by the wire, thus making it possible to obtain a semiconductor light-emitting device which is high in reliability and also high in luminance. Further, it is also possible to employ an n-type substrate for the light-emitting chip 206 to fabricate the following structure. More specifically, an n-type electrode is formed on the rear face of an n-type substrate, a p-type electrode is formed on the upper face of a semiconductor layer formed on the substrate, and the n-type electrode or the p-type electrode is mounted on one of leads. The rest of the p-type electrode and the n-type electrode are electrically connected through a wire with the other lead. The size of the light-emitting chip 206, the dimension and configuration of the recess 205 may be optionally modified.

It should be noted that the kinds of light-emitting device to which the luminescent material of this embodiment is applicable can be optionally changed. More specifically, even to a bombshell-type LED and a surface-mounted type LED, the luminescent material of this embodiment can be applied while securing the same effects as described above.

Next, the present invention will be explained in detail with reference to examples and comparative examples. These examples however are not intended to limit the present invention.

REFERENCE EXAMPLE 1

$SrCO_3$, AlN, $Si_3N_4$ and $Eu_2O_3$ were prepared as starting materials, and these starting materials were weighed to obtain 25.687, 8.198, 46.770 and 4.575 g, respectively. Then, these starting materials were mixed together with dehydrated isopropanol (IPA) for 24 hours in a ball mill. After IPA was volatilized and removed by drying at room temperature, the mixture was allowed to dry overnight in air atmosphere and at a temperature of 120° C. The resultant mixture was ground in a mortar and then charged in a carbon crucible. The mixture in the crucible was then subjected to sintering in a nitrogen atmosphere of 7.5 atm. for eight hours at a temperature of 1900° C. to synthesize a luminescent material of this reference example.

This luminescent material thus sintered was formed of a mixture of two kinds of sintered powder differing in body colors, and a white sintered powder and a red sintered powder were confirmed. When this luminescent material was excited by black light, a blue emission from the white powder and a red emission from the red powder were observed.

REFERENCE EXAMPLE 2

A luminescent material was synthesized in this reference example by following the same procedures as described in Reference Example 1 except that the loading of $SrCO_3$ was changed to 25.097 g and the loading of $Eu_2O_3$ was changed to 5.279 g.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 3

A luminescent material was synthesized in this reference example by following the same procedures as described in Reference Example 1 except that the loading of $SrCO_3$ was changed to 24.506 g and the loading of $Eu_2O_3$ was changed to 5.983 g.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 4

A luminescent material was synthesized in this reference example by following the same procedures as described in Reference Example 1 except that the loading of $SrCO_3$ was changed to 7.012 g and the loading of $Eu_2O_3$ was changed to 0.440 g.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

The red powder of Reference Example 1 was taken out of the crucible and ground in a mortar. This red powder was excited by an emission diode exhibiting a peak wavelength of 457 nm to observe the emission spectrum of the red powder. The red powders of Reference Examples 2 to 4 were also respectively taken out and ground in the same manner as the red powder of Reference Example 1 and excited using light having a peak wavelength of 457 nm to observe the emission spectrum of each of the red powders of Reference Examples 2 to 4.

The results thus obtained are shown in FIG. 3. In FIG. 3, the bands each exhibiting a peak at 457 nm were derived from the reflection of exciting beam. From every red powders, a single-band emission exhibiting a peak at a wavelength ranging from 620 to 640 nm was obtained. By the expression "single-band", it is intended to indicate an emission which appears as if the peak wavelength where the emission intensity becomes maximal is only one.

REFERENCE EXAMPLE 5

A luminescent material was synthesized in this reference example under the same conditions as described in Reference Example 1 except that the sintering temperature was changed to 1950° C.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 6

A luminescent material was synthesized in this reference example under the same conditions as described in Reference Example 2 except that the sintering temperature was changed to 1950° C.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 7

A luminescent material was synthesized in this reference example under the same conditions as described in Reference Example 3 except that the sintering temperature was changed to 1950° C.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 8

A luminescent material was synthesized in this reference example under the same conditions as described in Reference Example 4 except that the sintering temperature was changed to 1950° C.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

Figure 4:
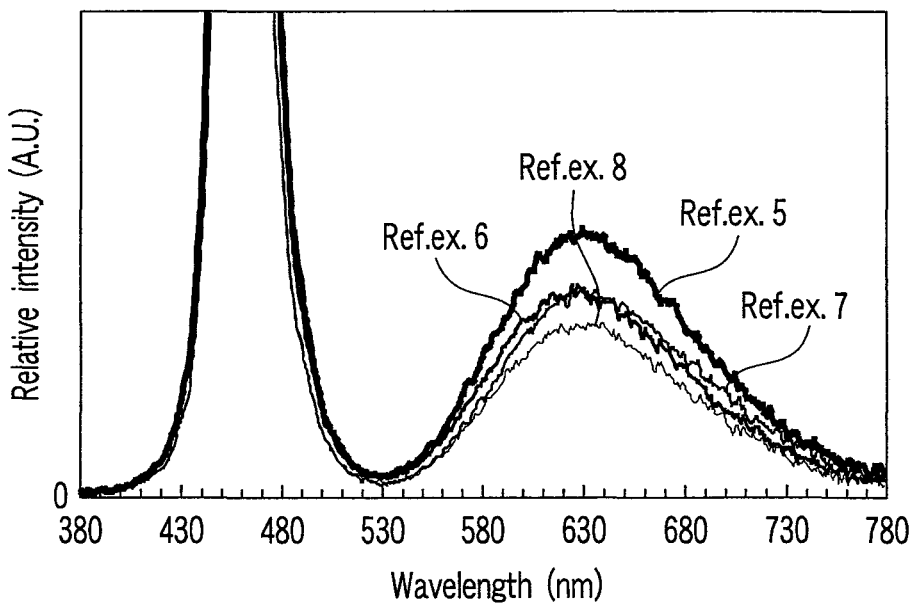
FIG. 4 are emission spectra obtained as the luminescent materials of Reference Examples 5-8 were excited by light having a wavelength of 457 nm.

The red powders of Reference Examples 5 to 8 were respectively taken out of the crucible and ground in a mortar in the same manner as described above. Then, the red powders were respectively excited by an emission diode exhibiting a peak wavelength of 457 nm. The emission spectrums thus obtained are shown in FIG. 4. In FIG. 4, the bands each exhibiting a peak at 457 nm were derived from the reflection of exciting beam. From every red powders, a single-band emission exhibiting a peak at a wavelength ranging from 620 to 640 nm was obtained.

Figure 5:
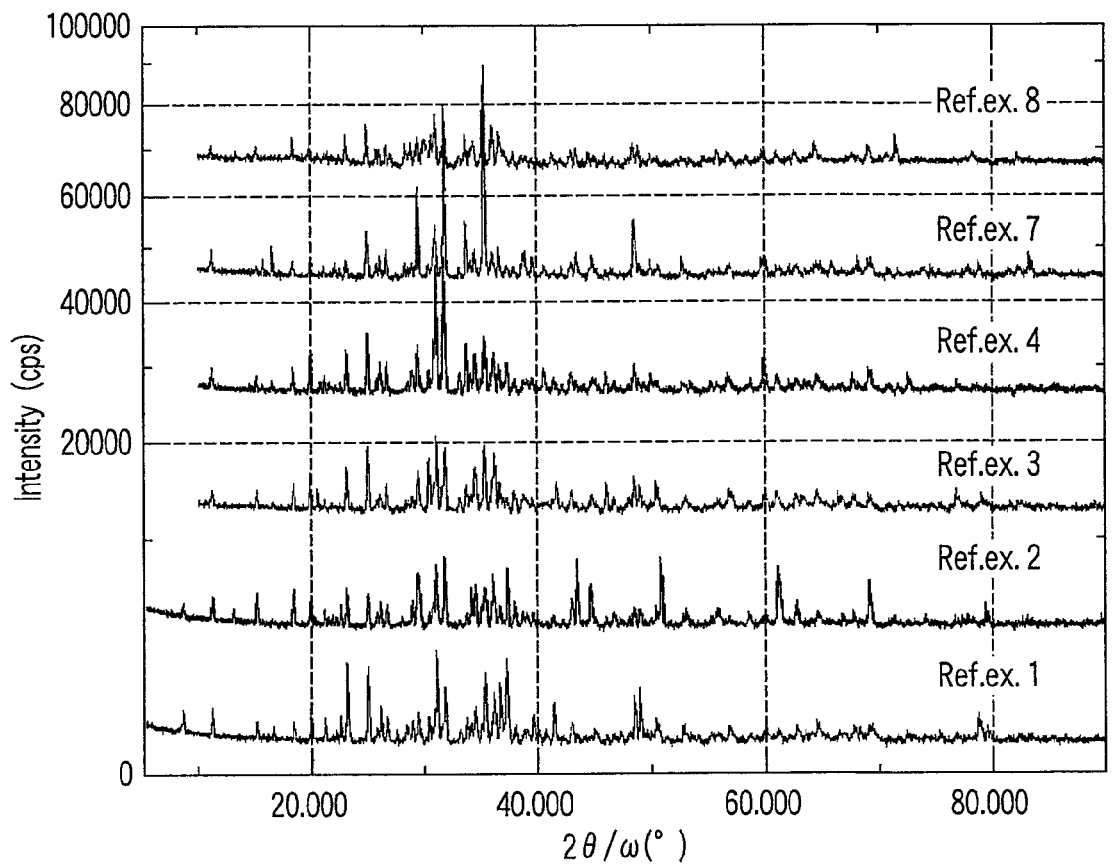
FIG. 5 are XRD profiles of the luminescent materials of Reference Examples 1-4, 7 and 8.

The red powders of Reference Examples 1-4, 7 and 8 were subjected to X-ray diffraction measurement employing CuKα characteristic X-rays (wavelength: 1.54056 Å). The profiles thus obtained are shown in FIG. 5. As shown in FIG. 5, since the profiles shown therein contained a large number of peaks, these red powders were assumed as having a relatively complicated structure.

It will be recognized that every red powders concurrently indicate diffraction peaks at diffraction angles (2θ) of 8.60-8.64, 11.16-11.20 and 18.26-18.30°. It was suggested that the peaks on the lower angle side were relatively large in unit lattice.

When this profile was collated with the JPCDS cards, there were no JPCDS cards data on existing substances which were identical with this profile. It should be noted that the JPCDS cards are a data book in which the peak profiles of various kinds of substances as obtained by X-ray diffraction are summarized.

It was found as a result of index numbering of peaks of the profile of red powder of Reference Example 1 that the lattice size of the red powder was quite identical with the space group Pnma, Pnc2 (rhombic system) of 11.7×4.96×21.4 Å. Further, as a result of the index numbering of peaks of the profile of red powder of Reference Example 2, it was found that the lattice size of the red powder was quite identical with the space group Pnma (rhombic system) P21/c (monoclinic system) of 11.7×4.96×21.4 Å. It will be recognized from these results that these luminescent materials were at least formed of rhombic system and the lattice size thereof was around 12×5×21 Å.

REFERENCE EXAMPLE 9

A luminescent material was synthesized in this reference example under the same conditions as described in Reference Example 2 except that the sintering temperature was changed to 1850° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 10

A luminescent material was synthesized in this reference example under the same conditions as described in Reference Example 3 except that the sintering temperature was changed to 1850° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 11

A luminescent material was synthesized in this reference example under the same conditions as described in Reference Example 4 except that the sintering temperature was changed to 1850° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

Figure 6:
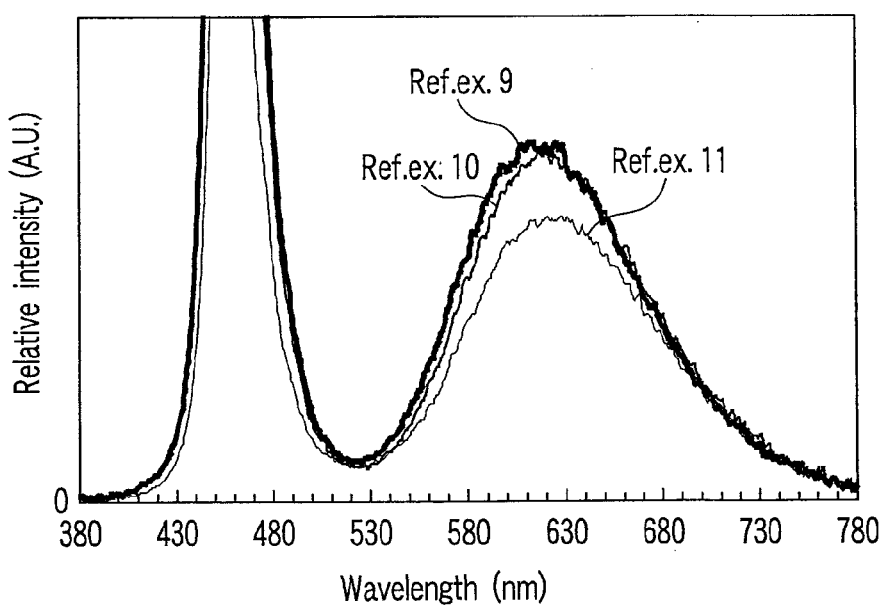
FIG. 6 are emission spectra obtained as the luminescent materials of Reference Examples 9-11 were excited by light having a wavelength of 457 nm.

The red powders of Reference Examples 9 to 11 were respectively taken out of the crucible and ground in a mortar in the same manner as described above. Then, the red powders were respectively excited by an emission diode exhibiting a peak wavelength of 457 nm. The emission spectrums thus obtained are shown in FIG. 6. In FIG. 6, the bands each exhibiting a peak at 457 nm were derived from the reflection of exciting beam. From every red powders, a single-band emission exhibiting a peak at a wavelength ranging from 610 to 620 nm was obtained.

REFERENCE EXAMPLE 12

A luminescent material was synthesized in this reference example by following the same procedures as described in Reference Example 1 except that the loading of $SrCO_3$ was changed to 13.287 g and the loading of $Eu_2O_3$ was changed to 1.760 g.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 13

A luminescent material was synthesized in this reference example under the same conditions as described in Reference Example 12 except that the sintering temperature was changed to 1800° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 14

A luminescent material was synthesized in this reference example under the same conditions as described in Reference Example 2 except that the sintering temperature was changed to 1800° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 15

A luminescent material was synthesized in this reference example under the same conditions as described in Reference Example 4 except that the sintering temperature was changed to 1800° C.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 16

A luminescent material was synthesized in this reference example by following the same procedures as described in Reference Example 14 except that the crucible was changed to a boron nitride crucible.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

Figure 7:
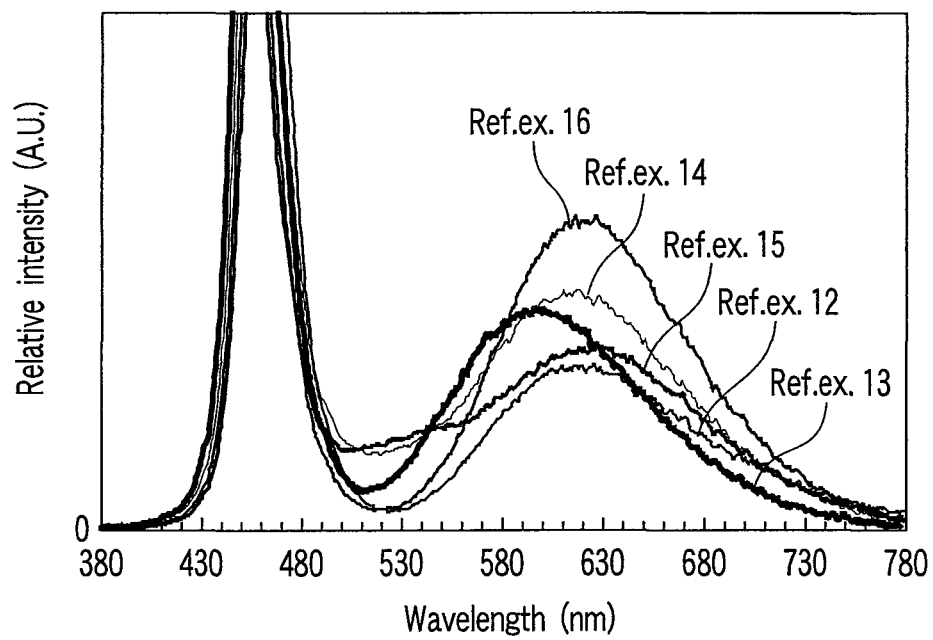
FIG. 7 are emission spectra obtained as the luminescent materials of Reference Examples 12-16 were excited by light having a wavelength of 457 nm.

The red powders of Reference Examples 12 to 16 were respectively taken out of the crucible and ground in a mortar in the same manner as described above. Then, the red powders were respectively excited by an emission diode exhibiting a peak wavelength of 457 nm. The emission spectrums thus obtained are shown in FIG. 7. In FIG. 7, the bands each exhibiting a peak at 457 nm were derived from the reflection of exciting beam. From every red powders, a single-band emission exhibiting a peak at a wavelength ranging from 600 to 630 nm was obtained.

REFERENCE EXAMPLE 17

A luminescent material was synthesized in this reference example by following the same procedures as described in Reference Example 2 except that the sintering time period was changed to 16 hours.

This luminescent material thus sintered was formed of a mixture of two kinds of sintered powder differing in body color, thus confirming existence of a white sintered powder and a red sintered powder. When this luminescent material was excited by black light, a blue emission from the white powder and a red emission from the red powder were observed.

REFERENCE EXAMPLE 18

31.371 g of $SrCO_3$, 12.296 g of AlN, 46.770 g of $Si_3N_4$ and 6.599 g of $Eu_2O_3$ were prepared as starting materials. Then, a luminescent material of this reference example was synthesized by following the same procedures as described in Reference Example 1 except that the sintering conditions thereof were changed to 1750° C. in temperature and 20 hours in sintering time.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

REFERENCE EXAMPLE 19

A luminescent material of this reference example was synthesized by following the same procedures as described in Reference Example 1 except that the sintering conditions thereof were changed to 1850° C. in temperature and 16 hours in sintering time.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

REFERENCE EXAMPLE 20

A luminescent material of this reference example was synthesized by following the same procedures as described in Reference Example 2 except that the sintering conditions thereof were changed to 1850° C. in temperature and 16 hours in sintering time.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

Figure 8:
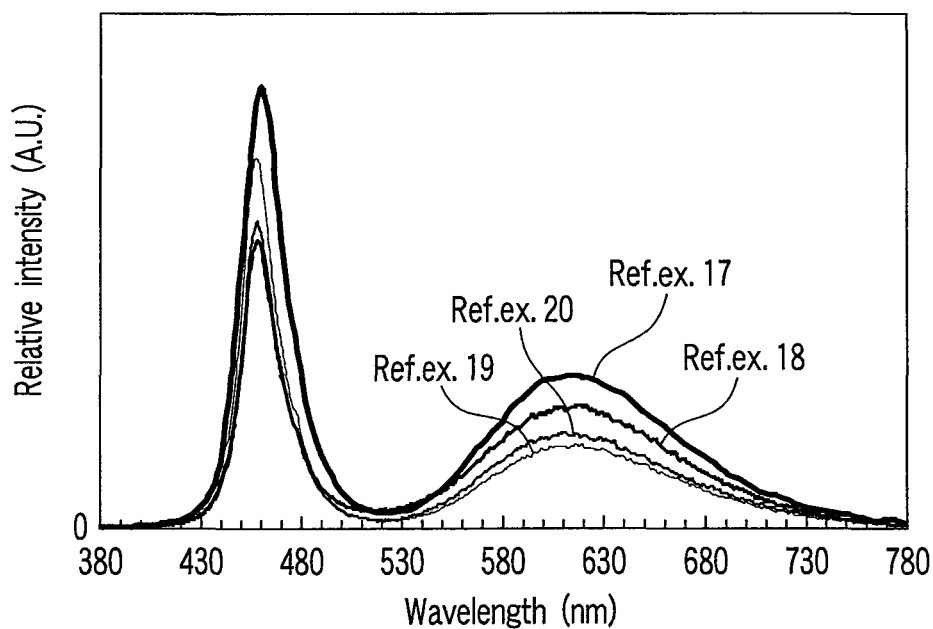
FIG. 8 are emission spectra obtained as the luminescent materials of Reference Examples 17-20 were excited by light having a wavelength of 457 nm.

The red powders of Reference Examples 17 to 20 were respectively taken out of the crucible and ground in a mortar in the same manner as described above. Then, the red powders were respectively excited by an emission diode exhibiting a peak wavelength of 457 nm. The emission spectrums thus obtained are shown in FIG. 8. In FIG. 8, the bands each exhibiting a peak at 457 nm were derived from the reflection of exciting beam. From every red powders, a single-band emission exhibiting a peak at a wavelength ranging from 616 to 618 nm was obtained.

The red powders of Reference Examples 1 to 4, 7, 8 and 17 were sorted out to perform the chemical analysis thereof, the results being summarized in the following Table 1. In this Table 1, there are shown the values of "a", "b", "c" and "d" in the aforementioned general formula (B).

TABLE 1

|  | a | b | c | d |
|---|---|---|---|---|
| Ref. Ex. 1 | 0.858 | 3.34 | 0.350 | 4.92 |
| Ref. Ex. 2 | 0.935 | 3.41 | 0.418 | 5.18 |
| Ref. Ex. 3 | 0.868 | 3.58 | 0.270 | 5.42 |
| Ref. Ex. 4 | 0.911 | 3.70 | 0.272 | 5.63 |
| Ref. Ex. 7 | 0.839 | 3.37 | 0.283 | 5.18 |
| Ref. Ex. 8 | 0.845 | 3.34 | 0.281 | 5.18 |
| Ref. Ex. 17 | 0.680 | 2.54 | 0.332 | 4.29 |

REFERENCE EXAMPLE 21

A luminescent material of this reference example was synthesized by following the same procedures as described in Reference Example 12 except that the sintering conditions thereof were changed to 1800° C. in temperature and 16 hours in sintering time.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

REFERENCE EXAMPLE 22

A luminescent material of this reference example was synthesized by following the same procedures as described in Reference Example 1 except that the sintering conditions thereof were changed to 1800° C. in temperature and 16 hours in sintering time.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

REFERENCE EXAMPLE 23

A luminescent material of this reference example was synthesized by following the same procedures as described in Reference Example 3 except that the sintering conditions thereof were changed to 1800° C. in temperature and 16 hours in sintering time.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

The red powders of Reference Examples 21 to 23 were respectively taken out of the crucible and ground in a mortar in the same manner as described above. Then, the red powders were respectively excited by an emission diode exhibiting a peak wavelength of 457 nm. The emission spectra thus obtained are shown in FIG. 9. In FIG. 9, the bands each exhibiting a peak at 457 nm were derived from the reflection of exciting beam. From every red powders, a single-band emission exhibiting a peak at a wavelength ranging from 615 to 645 nm was obtained.

REFERENCE EXAMPLE 24

A raw material powder that had been mixed, dried and ground in the same manner as that of Reference Example 1 was placed in a boron nitride crucible. Thereafter, the raw material powder was sintered for 24 hours at a temperature of 1900° C. in a nitrogen atmosphere of 7.5 atm. Then, the sintering of the raw material powder was continued for 64 hours at a temperature of 1800° C., thereby synthesizing the luminescent material of this reference example.

This luminescent material thus sintered was formed of a mixture of two kinds of sintered powder differing in body color, thus confirming existence of a red sintered powder and a yellowish green sintered powder. When this luminescent material was excited by black light, a red emission from the red powder and a yellowish green emission from the yellowish green powder were observed.

REFERENCE EXAMPLE 25

A raw material powder that had been mixed, dried and ground in the same manner as that of Reference Example 2 was placed in a boron nitride crucible. Thereafter, the raw material powder was sintered for 24 hours at a temperature of 1900° C. in a nitrogen atmosphere of 7.5 atm. Then, the sintering of the raw material powder was continued for 64 hours at a temperature of 1800° C., thereby synthesizing the luminescent material of this reference example.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

REFERENCE EXAMPLE 26

A raw material powder that had been mixed, dried and ground in the same manner as that of Reference Example 3 was placed in a boron nitride crucible. Thereafter, the raw material powder was sintered for 24 hours at a temperature of 1900° C. in a nitrogen atmosphere of 7.5 atm. Then, the sintering of the raw material powder was continued for 64 hours at a temperature of 1800° C., thereby synthesizing the luminescent material of this reference example.

This luminescent material thus sintered was formed of a mixture of three kinds of sintered powder differing in body color, thus confirming existence of a white sintered powder, a red sintered powder and a yellowish green powder. When this luminescent material was excited by black light, a blue emission from the white powder, a red emission from the red powder, and a yellowish green emission from the yellowish green powder were observed.

The red powders of Reference Examples 24 to 26 were respectively taken out of the crucible and ground in a mortar in the same manner as described above. Then, the red powders were respectively excited by an emission diode exhibiting a peak wavelength of 457 nm. The emission spectra thus obtained are shown in FIG. 10. In FIG. 10, the bands each exhibiting a peak at 457 nm were derived from the reflection of exciting beam. From every red powders, a single-band emission exhibiting a peak at a wavelength ranging from 580 to 610 nm was obtained.

REFERENCE EXAMPLE 27

$SrCO_3$, AlN, $Si_3N_4$ and $Eu_2O_3$ were employed as starting materials, and these starting materials were weighed to obtain 0.664, 0.410, 0.702 and 0.088 g, respectively. Then, these starting materials were sufficiently mixed together in a mortar and then charged in a carbon crucible. The mixture in the crucible was then subjected to sintering in a nitrogen atmosphere of 7.5 atm. for four hours at a temperature of 1800° C., thereby synthesizing a luminescent material of this reference example.

This luminescent material thus sintered was formed of a mixture of three kinds of sintered powder differing in body color, thus confirming existence of a white sintered powder, a red sintered powder and an orange sintered powder. When this luminescent material was excited by black light, a blue emission from the white powder, a red emission from the red powder and an orange emission from the orange powder were observed.

REFERENCE EXAMPLE 28

$SrCO_3$, AlN, $Si_3N_4$ and $Eu_2O_3$ were prepared as starting materials, and these starting materials were weighed to obtain 1.417, 0.820, 1.403 and 0.070 g, respectively. Then, these starting materials were sufficiently mixed together in a mortar and then charged in a carbon crucible. The mixture in the crucible was then subjected to sintering in a nitrogen atmosphere of 7.5 atm. for ten hours at a temperature of 1800° C., thereby synthesizing a luminescent material of this reference example.

This luminescent material thus sintered was formed of a mixture of three kinds of sintered powder differing in body color, thus confirming existence of a white sintered powder, a red sintered powder and an orange sintered powder. When this luminescent material was excited by black light, a blue emission from the white powder, a red emission from the red powder and an orange emission from the orange powder were observed.

REFERENCE EXAMPLE 29

$SrCO_3$, AlN, $Si_3N_4$ and $Eu_2O_3$ were prepared as starting materials, and these starting materials were weighed to obtain 1.402, 0.820, 1.403 and 0.088 g, respectively. Then, these starting materials were sufficiently mixed together in a mortar and then charged in a carbon crucible. The mixture in the crucible was then subjected to sintering in a nitrogen atmosphere of 7.5 atm. for ten hours at a temperature of 1800° C., thereby synthesizing a luminescent material of this reference example.

This luminescent material thus sintered was formed of a mixture of three kinds of sintered powder differing in body color, thus confirming existence of a white sintered powder, a red sintered powder and an orange sintered powder. When this luminescent material was excited by black light, a blue emission from the white powder, a red emission from the red powder and an orange emission from the orange powder were observed.

Figure 11:
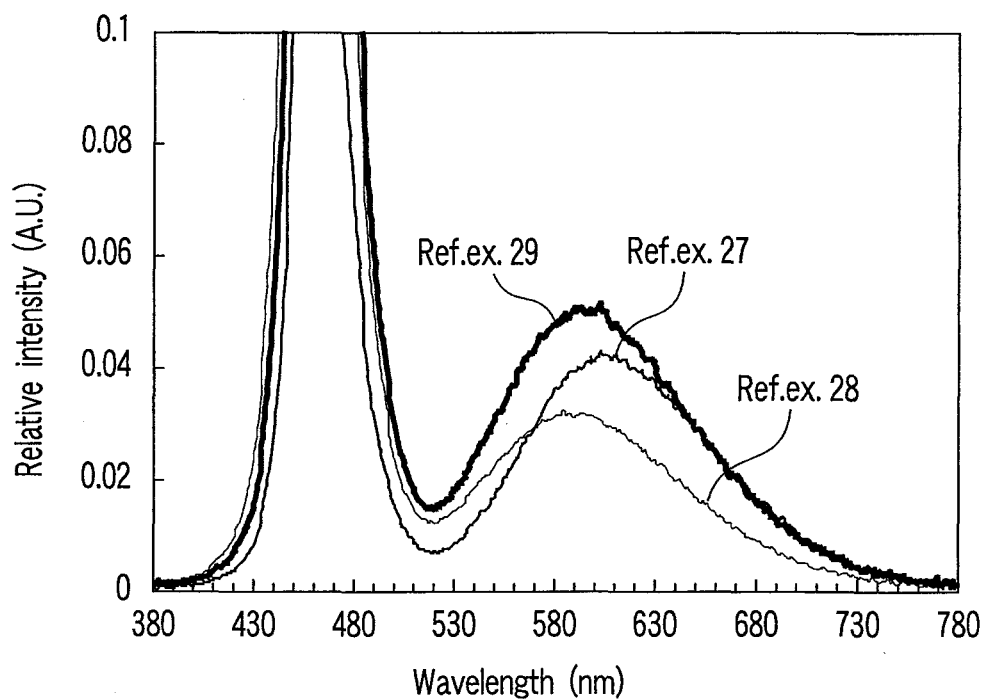
FIG. 11 are emission spectra obtained as the luminescent materials of Reference Examples 27-29 were excited by light having a wavelength of 457 nm.

The orange powders of Reference Examples 27 to 29 were respectively taken out of the crucible and ground in a mortar in the same manner as described above. Then, the orange powders were respectively excited by an emission diode exhibiting a peak wavelength of 457 nm. The emission spectrums thus obtained are shown in FIG. 11. In FIG. 11, the bands each exhibiting a peak at 457 nm were derived from the reflection of exciting beam. From every orange powder, a single-band emission exhibiting a peak at a wavelength ranging from 587 to 606 nm was obtained.

REFERENCE EXAMPLE 30

A luminescent material of this reference example was synthesized by following the same procedures as described in Reference Example 18 except that the sintering conditions thereof were changed to 1800° C. in temperature and 16 hours in sintering time.

This luminescent material thus sintered was formed of a mixture of three kinds of sintered powder differing in body color, thus confirming existence of a white sintered powder, a red sintered powder and an orange sintered powder. When this luminescent material was excited by black light, a blue emission from the white powder, a red emission from the red powder and an orange emission from the orange powder were observed.

Figure 12:
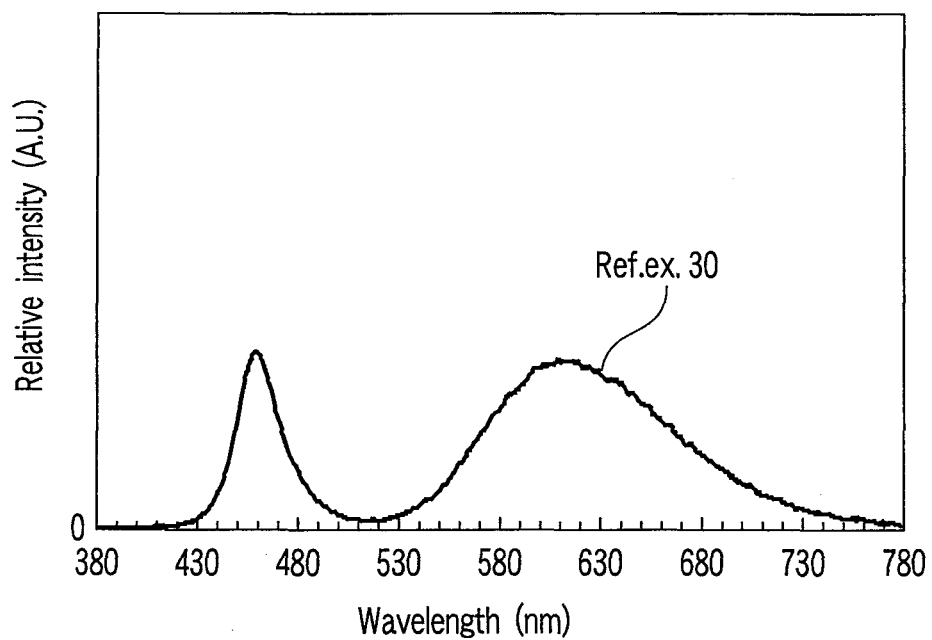
FIG. 12 is an emission spectrum obtained as the luminescent material of Reference Example 30 was excited by light having a wavelength of 457 nm.

The red powder of Reference Example 30 was taken out of the crucible and ground in a mortar in the same manner as described above. Then, the red powder was excited by an emission diode exhibiting a peak wavelength of 457 nm. The emission spectrum thus obtained is shown in FIG. 12. In FIG. 12, the band exhibiting a peak at 457 nm was derived from the reflection of exciting beam. FIG. 12 clearly indicates a single-band emission exhibiting a peak at a wavelength of 611 nm.

The values of absorption coefficient, quantum yield and luminous efficiency of the red powders of Reference Examples 1-26, the orange powders of Reference Examples 27-29 and the red powder of Reference Example 30 are summarized in the following Table 2.

TABLE 2

| | Peak wavelength (nm) | Absorption coefficient | Quantum efficiency | Luminescence efficiency |
|---|---|---|---|---|
| Ref. Ex. 1 | 622 | 0.83 | 0.23 | 0.19 |
| Ref. Ex. 2 | 631 | 0.85 | 0.22 | 0.19 |
| Ref. Ex. 3 | 633 | 0.87 | 0.17 | 0.15 |
| Ref. Ex. 4 | 642 | 0.93 | 0.12 | 0.11 |
| Ref. Ex. 5 | 630 | 0.79 | 0.22 | 0.18 |
| Ref. Ex. 6 | 628 | 0.81 | 0.17 | 0.14 |
| Ref. Ex. 7 | 630 | 0.85 | 0.16 | 0.14 |
| Ref. Ex. 8 | 640 | 0.85 | 0.13 | 0.11 |
| Ref. Ex. 9 | 614 | 0.79 | 0.33 | 0.26 |
| Ref. Ex. 10 | 617 | 0.81 | 0.32 | 0.26 |
| Ref. Ex. 11 | 621 | 0.88 | 0.25 | 0.22 |
| Ref. Ex. 12 | 626 | 0.74 | 0.29 | 0.21 |
| Ref. Ex. 13 | 602 | 0.78 | 0.32 | 0.25 |
| Ref. Ex. 14 | 619 | 0.78 | 0.38 | 0.29 |
| Ref. Ex. 15 | 629 | 0.85 | 0.29 | 0.25 |
| Ref. Ex. 16 | 628 | 0.85 | 0.42 | 0.36 |
| Ref. Ex. 17 | 616 | 0.82 | 0.37 | 0.30 |
| Ref. Ex. 18 | 618 | 0.88 | 0.32 | 0.28 |
| Ref. Ex. 19 | 618 | 0.86 | 0.22 | 0.19 |
| Ref. Ex. 20 | 617 | 0.88 | 0.24 | 0.21 |
| Ref. Ex. 21 | 616 | 0.90 | 0.16 | 0.15 |
| Ref. Ex. 22 | 627 | 0.91 | 0.20 | 0.18 |
| Ref. Ex. 23 | 645 | 0.91 | 0.21 | 0.19 |
| Ref. Ex. 24 | 614 | 0.71 | 0.44 | 0.31 |
| Ref. Ex. 25 | 647 | 0.72 | 0.37 | 0.27 |
| Ref. Ex. 26 | 646 | 0.77 | 0.34 | 0.26 |
| Ref. Ex. 27 | 604 | 0.77 | 0.32 | 0.24 |
| Ref. Ex. 28 | 587 | 0.53 | 0.35 | 0.19 |
| Ref. Ex. 29 | 587 | 0.53 | 0.35 | 0.19 |
| Ref. Ex. 30 | 587 | 0.53 | 0.35 | 0.19 |

As shown in Table 2, all of the red powders of Reference Examples 1-26, the orange powders of Reference Examples 27-29 and the red powder of Reference Example 30 were capable of exhibiting an emission wavelength falling within the range of 580 to 700 nm as they were excited by the light having a wavelength ranging from 250 to 500 nm. The absorption coefficient, quantum yield and luminous efficiency of these luminescent materials were by no means inferior to the conventional red-type luminescent materials such for example as $Sr_2Si_5N_8Eu$, etc.

It should be noted that, even if the exciting wavelength was changed to 254, 365, 390 or 460 nm, it was possible to confirm the emission having a peak in the aforementioned wavelength range. Because of the facts that if the exciting wavelength is too short, the loss due to Stokes shift would become prominent and that if the exciting wavelength is too long, the excitation efficiency would be deteriorated, the exciting wavelength should preferably be confined within the range of 380 to 460 nm. Further, the peak wavelength of emission should desirably be confined to 670 nm or less.

With respect to the compositions of red powders of Reference Examples 1-4, 7, 8 and 17, they are already shown in Table 1. The red powders and orange powders of other Reference Examples were also chemically analyzed to investigate the values of "a", "b", "c" and "d" in the aforementioned general formula (B).

As a result, it was found out that, in the cases of the red powders of Reference Examples 1-26, the orange powders of Reference Examples 27-29 and the red powder of Reference Example 30, the upper limit of the value of "a" was 0.948 and the lower limit thereof was 0.605. With respect to the upper limit and the lower limit of the value of "b", they were 3.88 and 2.10, respectively. With respect to the upper limit and the lower limit of the value of "c", they were 0.446 and 0.253, respectively. Further, with respect to the upper limit and the lower limit of the value of "d", they were 5.68 and 4.05, respectively.

Based on these results, the compositions of red powders of Reference Examples 1-26, the orange powders of Reference Examples 27-29 and the red powder of Reference Example 30 were found definable by the following general formula (1).

$$(M_{1-x}R_x)_{a1}AlSi_{b1}O_{c1}N_{d1} \quad (1)$$

In the general formula (1), M is at least one metallic element excluding Si and Al; R is a luminescence center element; and x, a1, b1, c1 and d1 satisfy following relationships:
0<x≦1, 0.6<a1<0.95, 2<b1<3.9
0.25<c1<0.45, 4<d1<5.7

When all of the compositions of red powders of Reference Examples 1-26, the orange powders of Reference Examples 27-29 and the red powder of Reference Example 30 were subjected to X-ray diffraction measurement employing CuKα characteristic X-rays (wavelength: 1.54056 Å), they exhibited concurrently diffraction peaks at least at diffraction angles (2θ) of 8.60-8.64, 11.16-11.20 and 18.26-18.30°.

EXAMPLE 1

A luminescent material was synthesized in this example by following the same procedures as described in Reference Example 21 except that the sintering conditions thereof were changed to 1800° C. in temperature and 72 hours in sintering time.

This luminescent material thus sintered was formed of a mixture of two kinds of sintered powder differing in body color, thus confirming existence of a yellowish green sintered powder and an orange sintered powder. When this luminescent material was excited by black light, a yellowish green emission from the yellowish green powder and an orange emission from the orange powder were observed.

EXAMPLE 2

A luminescent material was synthesized in this example by following the same procedures as described in Reference Example 22 except that the sintering conditions thereof were changed to 1800° C. in temperature and 72 hours in sintering time.

This luminescent material thus sintered was formed of a mixture of two kinds of sintered powder differing in body color, thus confirming existence of a yellowish green sintered powder and an orange sintered powder. When this luminescent material was excited by black light, a yellowish green emission from the yellowish green powder and an orange emission from the orange powder were observed.

EXAMPLE 3

A luminescent material was synthesized in this example by following the same procedures as described in Reference Example 23 except that the sintering conditions thereof were changed to 1800° C. in temperature and 72 hours in sintering time.

This luminescent material thus sintered was formed of a mixture of two kinds of sintered powder differing in body color, thus confirming existence of a yellowish green sintered powder and an orange sintered powder. When this luminescent material was excited by black light, a yellowish green emission from the yellowish green powder and an orange emission from the orange powder were observed.

When this yellowish green powder was subjected to X-ray diffraction measurement employing CuKα characteristic X-rays (wavelength: 1.54056 Å), it exhibited concurrently diffraction peaks at diffraction angles (2θ) of 11.831, 15.361, 20.451 and 23.840°.

EXAMPLE 4

A luminescent material was synthesized in this example by following the same procedures as described in Reference Example 24 except that the sintering conditions thereof were changed to 1800° C. in temperature and 72 hours in sintering time.

This luminescent material thus sintered was formed of a mixture of two kinds of sintered powder differing in body color, thus confirming existence of a yellowish green sintered powder and an orange sintered powder. When this luminescent material was excited by black light, a yellowish green emission from the yellowish green powder and an orange emission from the orange powder were observed.

Figure 13:
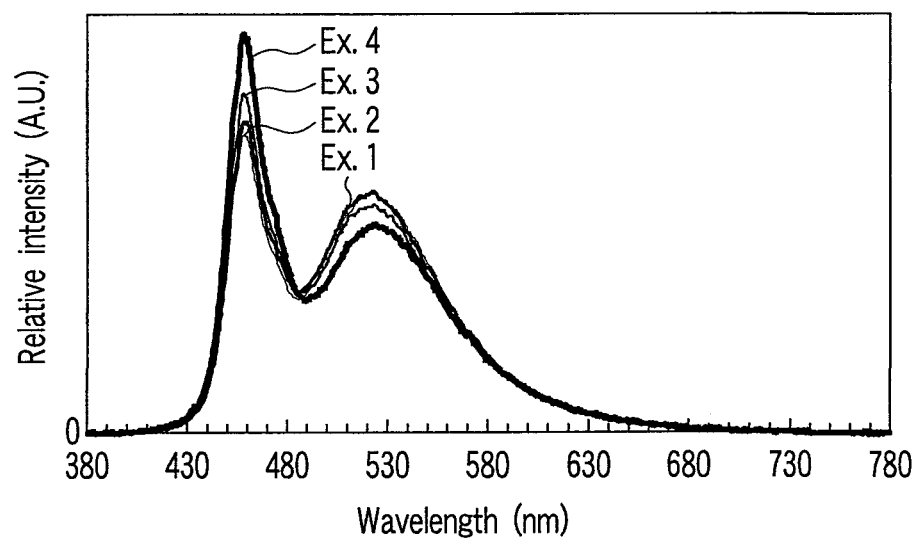
FIG. 13 are emission spectra obtained as the luminescent materials of Examples 1-4 were excited by light having a wavelength of 457 nm.

The yellowish green powders of Examples 1 to 4 were respectively taken out of the crucible and ground in a mortar in the same manner as described above. Then, the yellowish green powders were respectively excited by an emission diode exhibiting a peak wavelength of 457 nm. The emission spectrums thus obtained are shown in FIG. 13. In FIG. 13, the bands each exhibiting a peak at 457 nm were derived from the reflection of exciting beam. From every yellowish green powders, a single-band emission exhibiting a peak at a wavelength ranging from 522 to 524 nm was obtained.

The yellowish green powder of Example 3 was sorted out from the crucible to perform the chemical analysis thereof, the results being indicated in the following Table 3. In this Table 3, there are shown the values of "a", "b", "c" and "d" in the aforementioned general formula (B).

TABLE 3

|  | a | b | c | d |
|---|---|---|---|---|
| Ex. 3 | 0.940 | 4.15 | 0.63 | 6.30 |

The values of absorption coefficient, quantum yield and luminous efficiency of the yellowish green powders of Examples 1-4 as they were excited by the light having a wavelength of 457 nm are summarized in the following Table 4.

TABLE 4

|  | Peak wavelength (nm) | Absorption coefficient | Quantum efficiency | Luminescence efficiency |
|---|---|---|---|---|
| Ex. 1 | 522 | 0.84 | 0.48 | 0.40 |
| Ex. 2 | 522 | 0.85 | 0.48 | 0.40 |
| Ex. 3 | 524 | 0.83 | 0.45 | 0.38 |
| Ex. 4 | 524 | 0.80 | 0.45 | 0.36 |

As shown in Table 4, all of the yellowish green powders of Examples 1-4 were capable of exhibiting an emission wavelength falling within the range of 490 to 580 nm as they were excited by the light having a wavelength ranging from 250 to 500 nm. The absorption coefficient, quantum yield and luminous efficiency of these luminescent materials were by no means inferior to the conventional yellowish green luminescent materials such for example as $(Ba,Sr)_2SiO_4$:Eu, etc.

Further, the emission characteristics of the luminescent material of Example 2 as it was excited by the light having a wavelength of 450 nm were 87% in absorption coefficient, 48% in internal quantum yield and 42% in luminous efficiency. These results indicates that, as far as the yellowish green luminescent material of this embodiment is concerned, it has such emission characteristics that the excitation thereof using a wavelength of 450 nm is more advantageous in obtaining higher luminous efficiency than the excitation thereof using a wavelength of 460 nm.

It should be noted that N. Hirosaki et al., Extended Abstracts (53$^{rd}$ Spring Meeting), The Japan Society of Applied Physics and Related Societies, 25p-ZR-11 (2006), describes that the emission characteristics of Eu-activated β sialon as it was excited by the light having a wavelength of 450 nm were 65% in absorption coefficient, 53% in internal quantum yield and 35% in luminous efficiency. JP-A 2005-255895 (KOKAI) is a Patent Gazette related to the aforementioned Eu-activated β sialon. It will be recognized from the comparison between the luminous efficiency of this conventional luminescent material and the luminous efficiency of the luminescent material of this embodiment under the same condition with respect to the excitation wavelength that the yellowish green luminescent material of this embodiment is more excellent than the aforementioned conventional luminescent material.

Even if the exciting wavelength was changed to 254, 365, 390 or 460 nm, it was possible to confirm the emission having a peak in almost the same wavelength range as described above. Because of the facts that if the exciting wavelength is too short, the loss due to Stokes shift would become prominent and that if the exciting wavelength is too long, the excitation efficiency would be deteriorated, the exciting wavelength should preferably be confined within the range of 380 to 460 nm. Further, the peak wavelength of emission should desirably be confined to 560 nm or less. Additionally, the peak wavelength of emission should desirably be confined to 500 nm or more.

EXAMPLE 5

$SrCO_3$, AlN, $Si_3N_4$ and $Eu_2O_3$ were prepared as starting materials, and these starting materials were weighed to obtain 16.027, 4.837, 27.594 and 1.661 g, respectively. Then, these starting materials were mixed together with dehydrated isopropanol (IPA) for 2 hours in a ball mill. IPA was volatilized and removed by drying using mantle heater. Thereafter, the resultant mixture was passed through a sieve having an aperture of 300 μm to prepare a raw material powder. The raw material powder thus obtained was allowed to naturally drop from sieve having an aperture of 500-1000 μm, thereby enabling a boron nitride crucible to be filled with the raw material powder. The raw material powder in the crucible was then subjected to sintering in a nitrogen atmosphere of 7 atm. for 12 hours at a temperature of 1800° C. to synthesize a luminescent material of this reference example.

This luminescent material thus sintered was formed of a mixture of two kinds of sintered powder differing in body color, thus confirming existence of a white sintered powder and a yellowish green sintered powder. When this luminescent material was excited by black light, a blue emission from the white powder and a yellowish green emission from the yellowish green powder were observed.

EXAMPLE 6

A luminescent material was synthesized in this example by following the same procedures as described in Example 5 except that the loading of $SrCO_3$, AlN, $Si_3N_4$ and $Eu_2O_3$ was changed to 16.298, 4.919, 25.256 and 1.689 g, respectively. The raw material powder thus obtained was sintered for 6 hours at a temperature of 1850° C. to synthesize a luminescent material of this reference example.

This luminescent material thus sintered was formed of a mixture of three kinds of sintered powder differing in body color, thus confirming existence of a white sintered powder, a red sintered powder and a yellowish green sintered powder. When this luminescent material was excited by black light, a blue emission from the white powder, a red emission from the red powder and a yellowish green emission from the yellowish green powder were observed.

EXAMPLE 7

A luminescent material was synthesized in this example by following the same procedures as described in Example 6 except that the loading of $Si_3N_4$ was changed to 26.659 g.

This luminescent material thus sintered was formed of a mixture of three kinds of sintered powder differing in body color, thus confirming existence of a white sintered powder, a red sintered powder and a yellowish green sintered powder. When this luminescent material was excited by black light, a blue emission from the white powder, a red emission from the red powder and a yellowish green emission from the yellowish green powder were observed.

EXAMPLE 8

A luminescent material was synthesized in this example by following the same procedures as described in Example 7 except that the sintering conditions thereof were changed to 1800° C. in temperature and 16 hours in sintering time.

This luminescent material thus sintered was formed of a mixture of three kinds of sintered powder differing in body color, thus confirming existence of a white sintered powder, a red sintered powder and a yellowish green sintered powder. When this luminescent material was excited by black light, a blue emission from the white powder, a red emission from the red powder and a yellowish green emission from the yellowish green powder were observed.

EXAMPLE 9

A luminescent material was synthesized in this example by following the same procedures as described in Example 5 except that the sintering time period thereof were changed to 16 hours.

This luminescent material thus sintered was formed of a mixture of three kinds of sintered powder differing in body color, thus confirming existence of a white sintered powder, a red sintered powder and a yellowish green sintered powder. When this luminescent material was excited by black light, a blue emission from the white powder, a red emission from the red powder and a yellowish green emission from the yellowish green powder were observed.

EXAMPLE 10

A luminescent material was synthesized in this example by following the same procedures as described in Example 9 except that the loading of $Si_3N_4$ was changed to 29.465 g.

This luminescent material thus sintered was formed of a mixture of two kinds of sintered powder differing in body color, thus confirming existence of a white sintered powder and a yellowish green sintered powder. When this luminescent material was excited by black light, a blue emission from the white powder and a yellowish green emission from the yellowish green powder were observed.

When this yellowish green powder was subjected to X-ray diffraction measurement employing CuKα characteristic X-rays (wavelength: 1.54056 Å), it exhibited concurrently diffraction peaks at diffraction angles (2θ) of 11.870, 15.39, 20.47 and 23.79°.

EXAMPLE 11

A luminescent material was synthesized in this example by following the same procedures as described in Example 9 except that the loading of $Si_3N_4$ was changed to 30.868 g.

This luminescent material thus sintered was formed of a mixture of two kinds of sintered powder differing in body color, thus confirming existence of a white sintered powder and a yellowish green sintered powder. When this luminescent material was excited by black light, a blue emission from the white powder and a yellowish green emission from the yellowish green powder were observed.

EXAMPLE 12

A luminescent material was synthesized in this example by following the same procedures as described in Example 6 except that the loading of $Si_3N_4$ was changed to 29.465 g and the sintering time period was changed to 10 hours. This luminescent material thus sintered was formed of a sintered powder exhibiting a body color of yellowish green. When this luminescent material was excited by black light, a yellowish green emission was observed.

EXAMPLE 13

A luminescent material was synthesized in this example by following the same procedures as described in Example 5 except that the loading of $SrCO_3$ was changed to 16.550 g and the loading of $Eu_2O_3$ was changed to 1.038 g. This luminescent material thus sintered was formed of a sintered powder exhibiting a body color of yellowish green. When this luminescent material was excited by black light, a yellowish green emission was observed.

EXAMPLE 14

A luminescent material was synthesized in this example by following the same procedures as described in Example 12. This luminescent material thus sintered was formed of a sintered powder exhibiting a body color of yellowish green. When this luminescent material was excited by black light, a yellowish green emission was observed.

When this yellowish green powder was subjected to X-ray diffraction measurement employing CuKα characteristic X-rays (wavelength: 1.54056 Å), it exhibited concurrently diffraction peaks at diffraction angles (2θ) of 11.87, 15.39, 20.47 and 23.85°.

Figure 14:
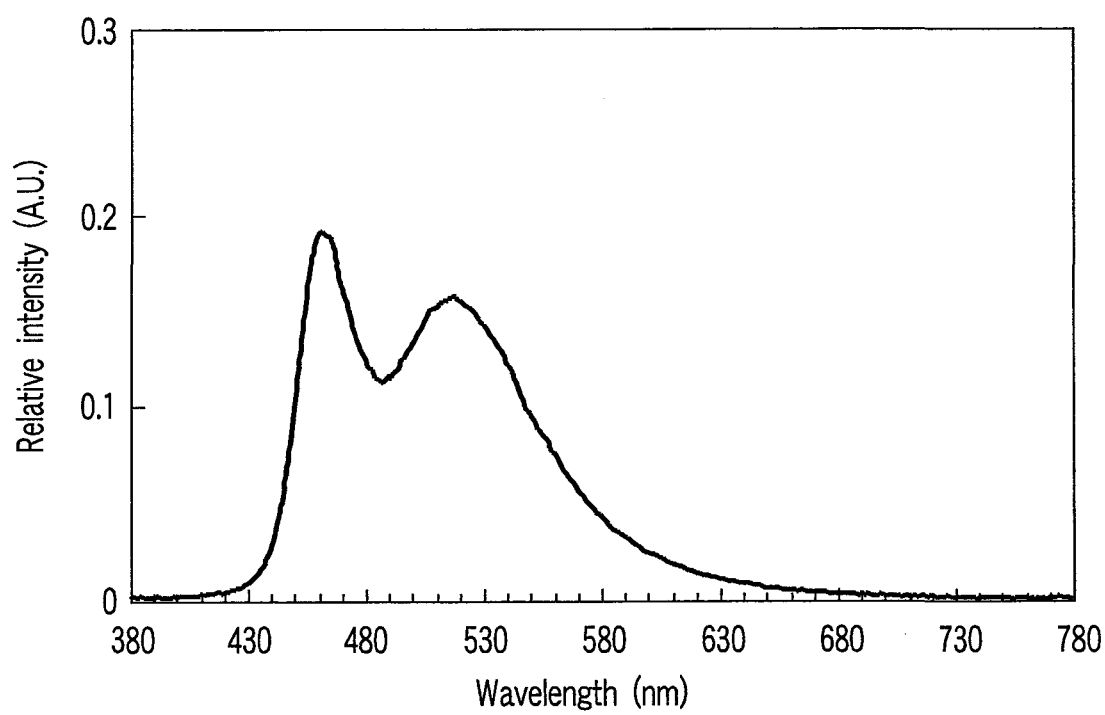
FIG. 14 is an emission spectrum obtained as the luminescent material of Example 5 was excited by light having a wavelength of 461 nm.

The yellowish green powder of Example 5 was excited by an emission diode exhibiting a peak wavelength of 461 nm. The emission spectrum thus obtained is shown in FIG. 14. In FIG. 14, the band exhibiting a peak at 461 nm was derived from the reflection of exciting beam. From this yellowish green powder, a single-band emission exhibiting a peak wavelength falling within the range of 514 to 518 nm was obtained.

Figure 15:
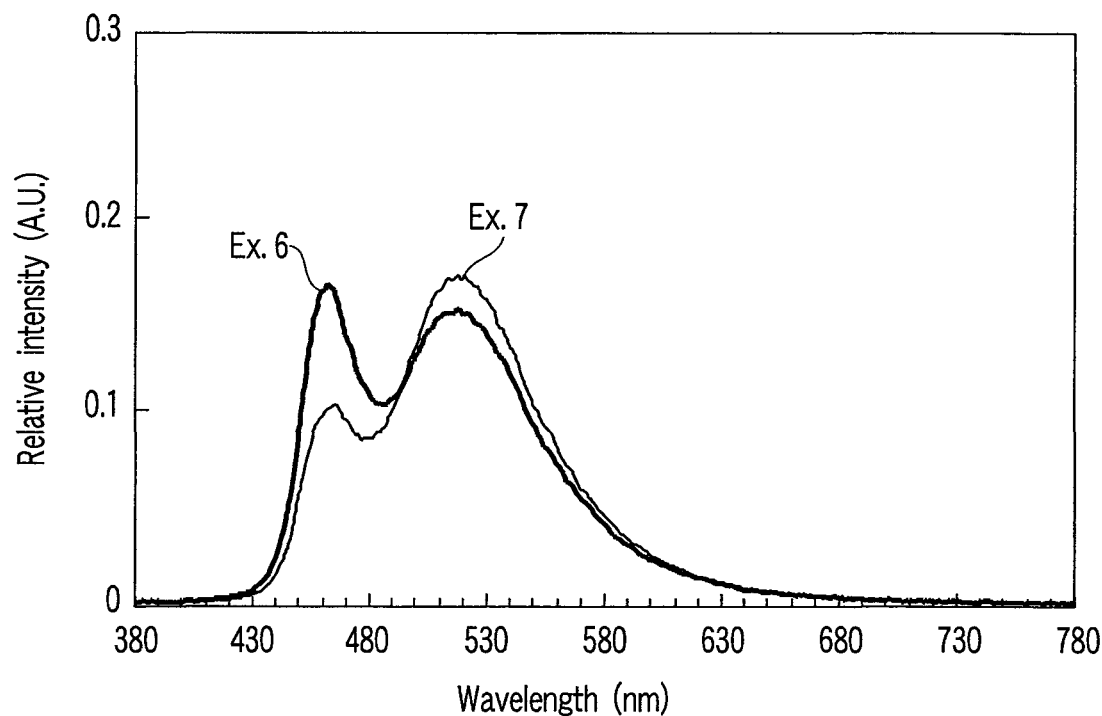
FIG. 15 are emission spectra obtained as the luminescent materials of Examples 6 and 7 were excited by light having a wavelength of 461 nm.

The yellowish green powders of Examples 6 and 7 were respectively excited by an emission diode exhibiting a peak wavelength of 461 nm. The emission spectrums thus obtained are shown in FIG. 15. In FIG. 15, the band exhibiting a peak at 461 nm was derived from the reflection of exciting beam. From these yellowish green powders, a single-band emission exhibiting a peak wavelength at 517 nm was obtained.

Figure 16:
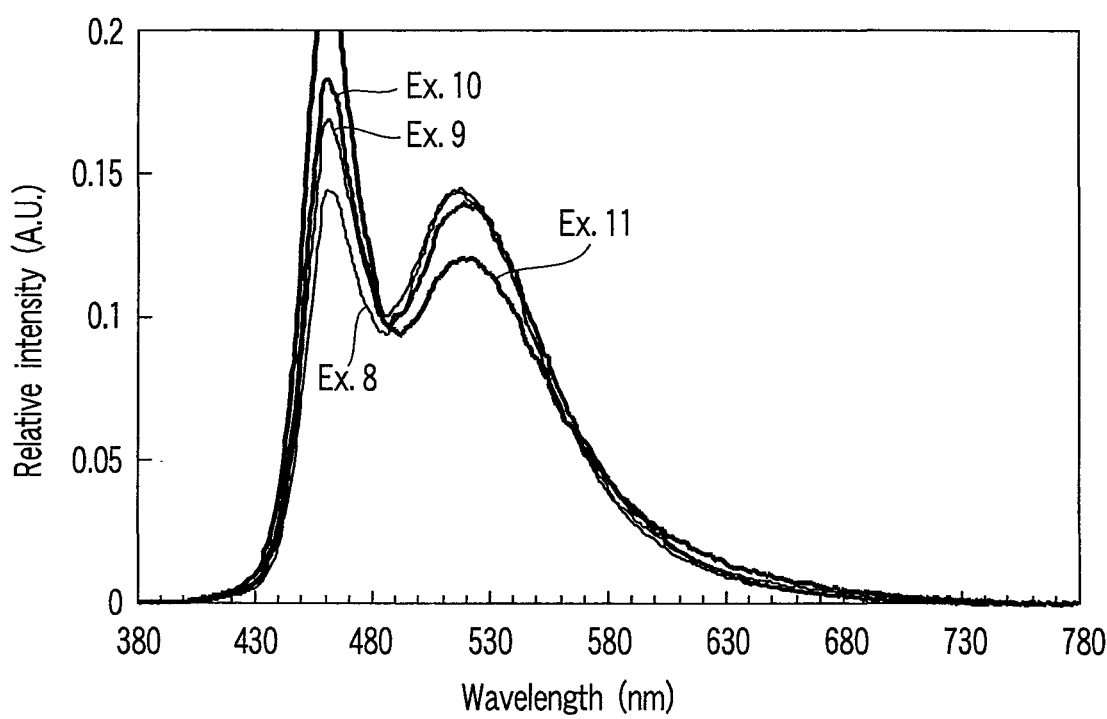
FIG. 16 are emission spectra obtained as the luminescent materials of Examples 8-11 were excited by light having a wavelength of 461 nm.

The yellowish green powders of Examples 8 to 11 were respectively excited by an emission diode exhibiting a peak wavelength of 461 nm. The emission spectrums thus obtained are shown in FIG. 16. In FIG. 16, the band exhibiting a peak at 461 nm was derived from the reflection of exciting beam. From these yellowish green powders, a single-band emission exhibiting a peak wavelength falling within the range of 517 to 520 nm was obtained.

The yellowish green powders of Examples 12 to 14 were respectively excited by an emission diode exhibiting a peak wavelength of 461 nm. The emission spectrums thus obtained are shown in FIG. 17. In FIG. 17, the band exhibiting a peak at 461 nm was derived from the reflection of exciting beam. From these yellowish green powders, a single-band emission exhibiting a peak wavelength falling within the range of 517 to 520 nm was obtained.

The yellowish green luminescent materials of Examples 5, 7, and 10-14 were respectively sorted out from the crucible to perform the chemical analysis thereof, the results being summarized in the following Table 5. In this Table 5, there are shown the values of "a", "b", "c" and "d" in the aforementioned general formula (B).

TABLE 5

|  | a | b | c | d |
|---|---|---|---|---|
| Ex. 5 | 0.940 | 4.12 | 0.71 | 6.7 |
| Ex. 7 | 0.950 | 4.41 | 0.82 | 8.8 |
| Ex. 10 | 0.963 | 4.28 | 0.64 | 6.9 |
| Ex. 11 | 1.09 | 5.73 | 0.68 | 9.7 |
| Ex. 12 | 1.30 | 5.70 | 0.85 | 11 |
| Ex. 13 | 1.06 | 4.78 | 0.71 | 7.3 |
| Ex. 14 | 1.03 | 4.61 | 0.74 | 7.4 |

The values of absorption coefficient, quantum yield and luminous efficiency of the yellowish green powders of Examples 5-14 are summarized in the following Table 6.

TABLE 6

|  | Peak wavelength (nm) | Absorption coefficient | Quantum efficiency | Luminescence efficiency |
|---|---|---|---|---|
| Ex. 5 | 518 | 0.79 | 0.58 | 0.46 |
| Ex. 6 | 514 | 0.84 | 0.55 | 0.46 |
| Ex. 7 | 517 | 0.91 | 0.56 | 0.51 |
| Ex. 8 | 517 | 0.84 | 0.53 | 0.45 |
| Ex. 9 | 518 | 0.81 | 0.54 | 0.44 |
| Ex. 10 | 520 | 0.80 | 0.55 | 0.44 |
| Ex. 11 | 520 | 0.75 | 0.54 | 0.41 |
| Ex. 12 | 514 | 0.64 | 0.62 | 0.40 |
| Ex. 13 | 511 | 0.72 | 0.59 | 0.43 |
| Ex. 14 | 516 | 0.80 | 0.59 | 0.48 |

As shown in Table 6, all of the yellowish green powders of Examples 5-14 were capable of exhibiting an emission wavelength falling within the range of 490 to 580 nm as they were excited by the light having a wavelength ranging from 250 to 500 nm. The absorption coefficient, quantum yield and luminous efficiency of these luminescent materials were by no means inferior to the conventional yellowish green luminescent materials such for example as $(Ba,Sr)_2SiO_4$:Eu, etc.

With respect to the compositions of yellowish green powders of Examples 3, 5, 7, and 10-14, they are already shown in Table 1. The yellowish green powders of other Examples were also chemically analyzed to investigate the values of "a", "b", "c" and "d" in the aforementioned general formula (B).

As a result, it was found out that, in the cases of the yellowish green powders of Reference Examples 1-14, the upper limit of the value of "a" was 1.30 and the lower limit thereof was 0.940. With respect to the upper limit and the lower limit of the value of "b", they were 5.73 and 4.12, respectively. With respect to the upper limit and the lower limit of the value of "c", they were 0.85 and 0.63, respectively. Further, with respect to the upper limit and the lower limit of the value of "d", they were 11 and 6.3, respectively.

Based on these results, the compositions of yellowish green powders of Examples 1-14 were found definable by the following general formula (2).

$(M_{1-x}R_x)_{a2}AlSi_{b2}O_{c2}N_{d2}$ (2)

In the general formula (2), M is at least one kind of metallic element excluding Si and Al; R is a luminescence center element; and x, a2, b2, c2 and d2 satisfy the following relationships:

$0 < x \leq 1$, $0.93 < a2 < 1.3$, $4.0 < b2 < 5.8$
$0.6 < c2 < 1$, and $6 < d2 < 11$.

The yellowish green luminescent materials of Examples 5-8 and 14 were found capable of exhibiting a luminous efficiency of 45% or more, thus indicating excellent luminous efficiency. The compositions of yellowish green powders of Examples 1-14 which were especially excellent in luminous efficiency can be defined by the general formula (2) wherein a2, b2, c2 and d2 satisfy the following relationships:

$0.94 < a2 < 1.1$, $4.1 < b2 < 4.7$
$0.7 < c2 < 0.85$, $7 < d2 < 9$.

When all of the yellowish green powders of Examples 1-14 were subjected to X-ray diffraction measurement employing CuKα characteristic X-rays (wavelength: 1.54056 Å), they exhibited concurrently diffraction peaks at least at diffraction angles (2θ) of 11.81-11.85, 15.34-15.38, 20.40-20.47 and 23.74-23.86°.

REFERENCE EXAMPLE 31

$SrCO_3$, AlN, $Si_3N_4$ and $Eu_2O_3$ were prepared as starting materials, and these starting materials were weighed to obtain 29.378, 16.395, 28.062 and 0.176 g, respectively. Then, these starting materials were mixed together with dehydrated isopropanol (IPA) for 24 hours in a ball mill. After IPA was volatilized and removed by room temperature drying, the mixture was allowed to dry overnight in air atmosphere and at a temperature of 120° C. The resultant mixture was ground in a mortar and then charged in a carbon crucible. Finally, the mixture in the crucible was subjected to sintering in a nitrogen atmosphere of 7.5 atm. for 60 hours at a temperature of 1800° C. to synthesize a luminescent material, wherein this sintering was repeated twice under the same conditions.

This luminescent material thus sintered was formed of a mixture of sintered powders differing in body color, i.e., a white sintered powder, a minute amount of orange sintered powder and a minute amount of red sintered powder. When this luminescent material was excited by black light, a blue emission from the white powder, an orange emission from the minute amount of orange sintered powder and a red emission from the minute amount of red powder were observed.

This red powder was dispensed and subjected to X-ray diffraction measurement employing CuKα characteristic X-rays (wavelength: 1.54056 Å). As a result, it exhibited concurrently diffraction peaks at diffraction angles (2θ) of 13.10, 18.62, 20.22, 26.40 and 28.04°.

When this red powder was subjected to chemical analysis, it was possible to confirm a composition represented by $(M_{0.991}R_{0.009})_{2.23}AlSi_{4.75}O_{0.80}N_{7.88}$. The red powder of this reference example can be defined, by the values of a, b, c and d in the aforementioned general formula (B), such that the value of $(1+b)/a$ is 2.58 and the value of $(c+d)/a$ is 3.93.

REFERENCE EXAMPLE 32

A luminescent material was synthesized in this example under the same conditions as described in Reference Example 31 except that the loading of $SrCO_3$ was changed to 29.231 g and the loading of $Eu_2O_3$ was changed to 0.352 g.

This luminescent material thus sintered was formed of a mixture of sintered powders differing in body color, i.e., a white sintered powder, a minute amount of orange sintered powder and a minute amount of red sintered powder. When this luminescent material was excited by black light, a blue emission from the white powder, an orange emission from the minute amount of orange sintered powder and a red emission from the minute amount of red powder were observed.

REFERENCE EXAMPLE 33

A luminescent material was synthesized in this example under the same conditions as described in Reference Example 31 except that the loading of $SrCO_3$ was changed to 28.935 g and the loading of $Eu_2O_3$ was changed to 0.704 g.

This luminescent material thus sintered was formed of a mixture of sintered powders differing in body color, i.e., a white sintered powder, a minute amount of orange sintered powder and a minute amount of red sintered powder. When this luminescent material was excited by black light, a blue emission from the white powder, an orange emission from the minute amount of orange sintered powder and a red emission from the minute amount of red powder were observed.

This red powder was dispensed and subjected to X-ray diffraction measurement employing CuKα characteristic X-rays (wavelength: 1.54056 Å). As a result, it exhibited concurrently diffraction peaks at diffraction angles (2θ) of 13.08, 18.62, 20.18, 26.38 and 28.02°.

REFERENCE EXAMPLE 34

A luminescent material was synthesized in this example under the same conditions as described in Reference Example 31 except that the loading of $SrCO_3$ was changed to 28.640 g and the loading of $Eu_2O_3$ was changed to 1.056 g.

This luminescent material thus sintered was formed of a mixture of sintered powders differing in body color, i.e., a white sintered powder, a minute amount of orange sintered powder and a minute amount of red sintered powder. When this luminescent material was excited by black light, a blue emission from the white powder, an orange emission from the minute amount of orange sintered powder and a red emission from the minute amount of red powder were observed.

This red powder was dispensed and subjected to X-ray diffraction measurement employing CuKα characteristic X-rays (wavelength: 1.54056 Å). As a result, it exhibited concurrently diffraction peaks at diffraction angles (2θ) of 13.10, 18.60, 20.20, 26.38 and 28.03°.

The red powders of Reference Examples 31-34 were respectively taken out of the crucible and ground in a mortar in the same manner as described above. Then, the red powders were respectively excited by an emission diode exhibiting a peak wavelength of 457 nm. The emission spectrums thus obtained are shown in FIG. 18. In FIG. 18, the band exhibiting a peak at 457 nm was derived from the reflection of exciting beam. A single-band emission exhibiting a peak at a wavelength ranging from 620 to 640 nm was obtained from all of these red powders.

REFERENCE EXAMPLE 35

The same kind of raw material as that of Reference Example 31 was placed in a carbon crucible. Thereafter, the raw material was sintered for 60 hours at a temperature of 1800° C. in a nitrogen atmosphere of 7.5 atm., thereby synthesizing the luminescent material of this reference example.

This luminescent material thus sintered was formed of a mixture of two kinds of sintered powder differing in body color, thus confirming existence of a white sintered powder and a red sintered powder. When this luminescent material was excited by black light, a blue emission from the white powder, and a red emission from the red powder were observed.

This red powder was then subjected to X-ray diffraction measurement employing CuKα characteristic X-rays (wavelength: 1.54056 Å). As a result, it exhibited concurrently diffraction peaks at diffraction angles (2θ) of 13.12, 18.64, 20.22, 26.40 and 28.04°.

REFERENCE EXAMPLE 36

The same kind of raw material as that of Reference Example 32 was placed in a carbon crucible. Thereafter, the raw material was sintered for 60 hours at a temperature of 1800° C. in a nitrogen atmosphere of 7.5 atm., thereby synthesizing the luminescent material of this reference example.

This luminescent material thus sintered was formed of a mixture of two kinds of sintered powder differing in body color, thus confirming existence of a white sintered powder and a red sintered powder. When this luminescent material was excited by black light, a blue emission from the white powder, and a red emission from the red powder were observed.

REFERENCE EXAMPLE 37

The same kind of raw material as that of Reference Example 33 was placed in a carbon crucible. Thereafter, the raw material was sintered for 60 hours at a temperature of 1800° C. in a nitrogen atmosphere of 7.5 atm., thereby synthesizing the luminescent material of this reference example.

This luminescent material thus sintered was formed of a mixture of two kinds of sintered powder differing in body color, thus confirming existence of a white sintered powder and a red sintered powder. When this luminescent material was excited by black light, a blue emission from the white powder, and a red emission from the red powder were observed.

REFERENCE EXAMPLE 38

The same kind of raw material as that of Reference Example 34 was placed in a carbon crucible. Thereafter, the raw material was sintered for 60 hours at a temperature of 1800° C. in a nitrogen atmosphere of 7.5 atm., thereby synthesizing the luminescent material of this reference example.

This luminescent material thus sintered was formed of a mixture of two kinds of sintered powder differing in body color, thus confirming existence of a white sintered powder and a red sintered powder. When this luminescent material was excited by black light, a blue emission from the white powder, and a red emission from the red powder were observed.

Figure 19:
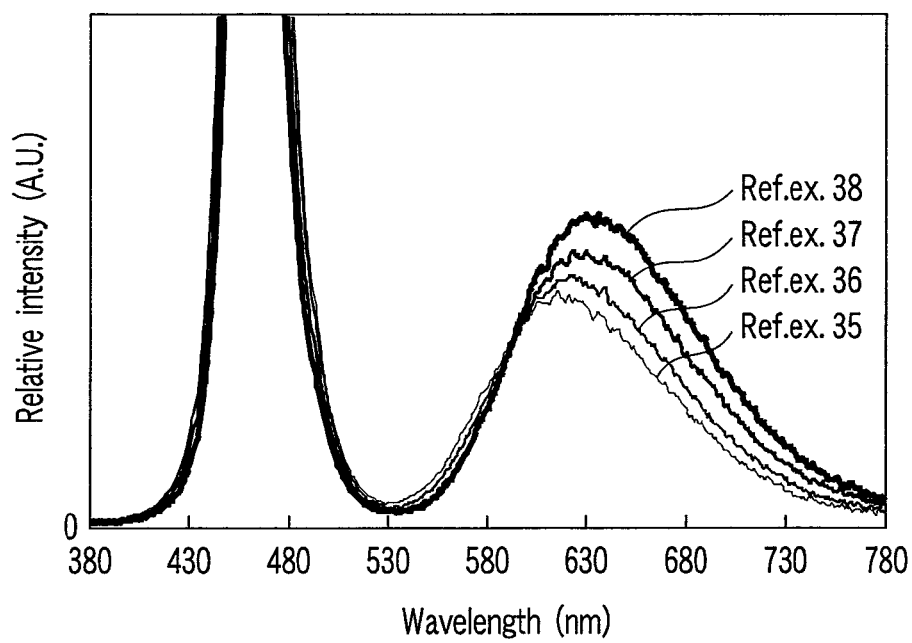
FIG. 19 are emission spectra obtained as the luminescent materials of Reference Examples 35-38 were excited by light having a wavelength of 457 nm.

The red powders of Reference Examples 35-38 were respectively taken out of the crucible and ground in a mortar in the same manner as described above. Then, the red powders were respectively excited by an emission diode exhibiting a peak wavelength of 457 nm. The emission spectrums thus obtained are shown in FIG. 19. In FIG. 19, the band exhibiting a peak at 457 nm was derived from the reflection of exciting beam. A single-band emission exhibiting a peak at a wavelength ranging from 610 to 640 nm was obtained from all of these red powders.

REFERENCE EXAMPLE 39

$SrCO_3$, AlN, $Si_3N_4$ and $Eu_2O_3$ were prepared as starting materials, and these starting materials were weighed to obtain 2.923, 1.640, 2.806 and 0.035 g, respectively. Then, these starting materials were mixed together in a mortar for 20 minutes and then placed in a carbon crucible. The mixture in the crucible was then subjected to sintering in a nitrogen atmosphere of 7.5 atm. for four hours at a temperature of 1800° C., thereby synthesizing a luminescent material of this reference example.

This luminescent material thus sintered was formed of a mixture of sintered powders differing in body color, i.e., a white sintered powder, a minute amount of orange sintered powder and a minute amount of red sintered powder. When this luminescent material was excited by black light, a blue emission from the white powder, an orange emission from the minute amount of orange sintered powder and a red emission from the minute amount of red powder were observed.

Figure 20:
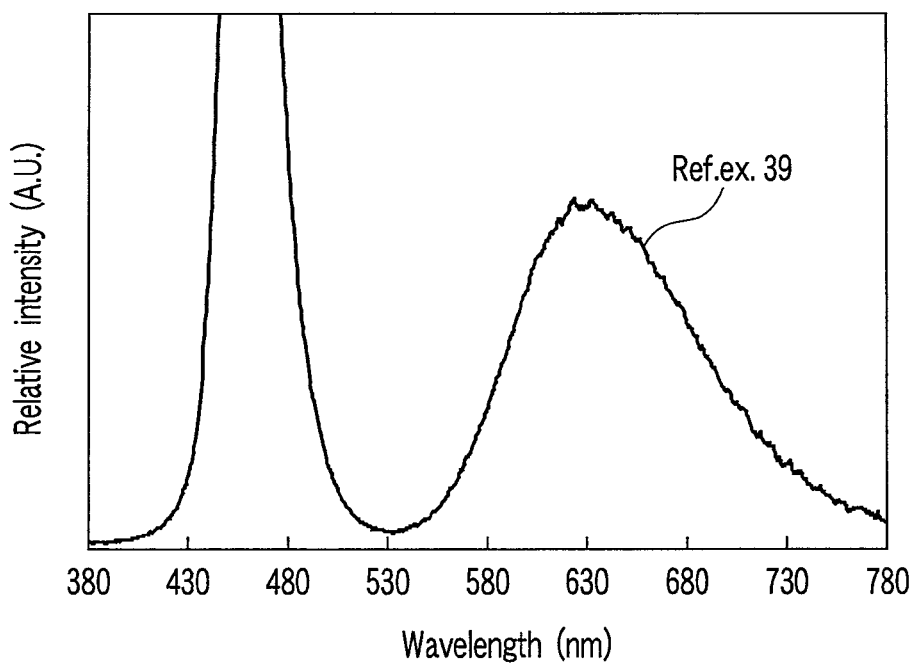
FIG. 20 is an emission spectrum obtained as the luminescent material of Reference Example 39 was excited by light having a wavelength of 457 nm.

The red powder of Reference Example 39 was taken out of the crucible and ground in a mortar in the same manner as described above. Then, the red powder was excited by an emission diode exhibiting a peak wavelength of 457 nm. The emission spectrum thus obtained is shown in FIG. 20. In FIG. 20, the band exhibiting a peak at 457 nm was derived from the reflection of exciting beam. A single-band emission exhibiting a peak at a wavelength ranging from 610 to 640 nm was obtained from the red powder.

The values of absorption coefficient, quantum yield and luminous efficiency of the yellowish green powders of Reference Examples 31-39 are summarized in the following Table 7.

TABLE 7

|  | Peak wavelength (nm) | Absorption coefficient | Quantum efficiency | Luminescence efficiency |
|---|---|---|---|---|
| Ref. Ex. 31 | 621 | 0.63 | 0.52 | 0.33 |
| Ref. Ex. 32 | 625 | 0.77 | 0.53 | 0.41 |
| Ref. Ex. 33 | 626 | 0.79 | 0.53 | 0.42 |
| Ref. Ex. 34 | 646 | 0.83 | 0.49 | 0.41 |
| Ref. Ex. 35 | 616 | 0.62 | 0.40 | 0.25 |
| Ref. Ex. 36 | 623 | 0.64 | 0.42 | 0.27 |
| Ref. Ex. 37 | 624 | 0.69 | 0.44 | 0.30 |
| Ref. Ex. 38 | 637 | 0.74 | 0.47 | 0.35 |
| Ref. Ex. 39 | 633 | 0.75 | 0.46 | 0.35 |

As shown in Table 7, all of the yellowish green powders of Reference Examples 31-39 were capable of exhibiting an emission wavelength falling within the range of 580 to 700 nm as they were excited by the light having a wavelength ranging from 250 to 500 nm. The absorption coefficient, quantum yield and luminous efficiency of these luminescent materials were by no means inferior to the conventional yellowish green luminescent materials such for example as $Sr_2Si_5N_8$:Eu, etc.

Even if the exciting wavelength was changed to 254, 365, 390 or 460 nm, it was possible to confirm the emission having a peak in almost the same wavelength range as described above. Because of the facts that if the exciting wavelength is too short, the loss due to Stokes shift would become prominent and that if the exciting wavelength is too long, the excitation efficiency would be deteriorated, the exciting wavelength should preferably be confined within the range of 380 to 460 nm. Further, the peak wavelength of emission should desirably be confined to 670 nm or less.

With respect to the composition of red powder of Reference Example 31, it is already explained above. The red powders of other Reference Examples were also chemically analyzed to investigate the values of "a", "b", "c" and "d" in the aforementioned composition formula (B). As a result, it was found out that, in the cases of the red powders of Reference Examples 31-39, the lower limit and the upper limit of the value of (1+b)/a was 2.41 and 2.58, respectively. Further, the lower limit and the upper limit of the value of (c+d)/a was 3.48 and 4.17, respectively.

Based on these results, the compositions of yellowish green powders of Reference Examples 31-39 were found definable by the following general formula (3).

$$(M_{1-x}R_x)_{a3}AlSi_{b3}O_{c3}N_{d3} \quad\quad (3)$$

In the general formula (3), M is at least one metallic element excluding Si and Al; R is a luminescence center element; and x, a3, b3, c3 and d3 satisfy the following relationships:

$0 < x \leq 1$, $2.4 < (1+b3)/a3 < 2.6$ $3.4 < (c3+d3)/a3 < 4.2$.

When all of the compositions of red powders of Reference Examples 31-39 were subjected to X-ray diffraction measurement employing CuKα characteristic X-rays (wavelength: 1.54056 Å), they exhibited concurrently diffraction peaks at least at diffraction angles (2θ) of 13.06-13.16, 18.58-18.68, 20.14-20.24, 26.32-26.46 and 27.98-28.10°.

COMPARATIVE EXAMPLE 1

26.573 g of $SrCO_3$, 23.385 g of $Si_3N_4$ and 3.519 g of $Eu_2O_3$ were prepared as starting materials, and these starting materials were mixed together in a ball mill. The resultant mixture was placed in a carbon crucible and then subjected to sintering in a nitrogen atmosphere of 7 atm. for 8 hours at a temperature of 1650° C. to synthesize a luminescent material of this comparative example.

As a result of chemical analysis, the luminescent material of this comparative example was confirmed as having a composition represented by $(Sr_{0.9}Eu_{0.1})_2Si_5N_8$. The luminescent material thus obtained was a vermilion sintered body and when it was excited by black light, a red emission was observed.

COMPARATIVE EXAMPLE 2

148 g of $SrCO_3$ and 0.176 g of $Eu_2O_3$ were prepared as starting materials, and these starting materials were mixed together in a mortar. The resultant mixed powder was placed in a quartz crucible and then subjected to sintering in a $H_2S$ atmosphere of 1 atm. for one hour at a temperature of 1100° C. The sintered mixture was further powdered and blended with 2 g of $NH_4Cl$. The resultant mixture was further mixed in a mortar and sealed in a quartz tube. Thereafter, the mixture was sintered for one hour at a temperature of 1100° C. in a nitrogen atmosphere of 1 atm., thereby synthesizing the luminescent material of this comparative example.

As a result of chemical analysis, the luminescent material of this comparative example was confirmed as having a composition represented by $(Sr_{0.999}Eu_{0.001})_2S$. The luminescent material thus obtained was a pink sintered body and when it was excited by black light, a red emission exhibiting a peak wavelength of 620 nm was observed.

COMPARATIVE EXAMPLE 3

17.066 g of $SrCO_3$, 8.198 g of AlN, 23.759 g of $Si_3N_4$ and 3.590 g of $Eu_2O_3$ were prepared as starting materials. These starting materials were mixed, dried and ground in the same manner as Example 1. After being placed in a carbon crucible, the resultant mixture was sintered using a hot press for two hours at a press pressure of 350 MPa and a temperature of 1800° C. in a nitrogen atmosphere of 3.5 atm. The sample thus sintered was formed of a sintered body having a gray-yellowish green body color and when it was excited by black light, a weak yellowish green emission was observed.

COMPARATIVE EXAMPLE 4

A luminescent material was synthesized in this comparative example in the same manner as in Comparative Example 3 except that 17.693 g of $SrCO_3$, 6.148 g of AlN, 29.114 g of $Si_3N_4$ and 3.722 g of $Eu_2O_3$ were employed as starting materials. The sample thus sintered was formed of a sintered body having a gray-yellowish green body color and when it was excited by black light, a weak yellowish green emission was observed.

COMPARATIVE EXAMPLE 5

A raw material that had been weighed and mixed in the same manner as in Reference Example 1 was placed in a carbon crucible and sintered in the same manner as in Comparative Example 3, thereby synthesizing a luminescent material of this comparative example. The sample thus sintered was formed of a sintered body having a gray-yellowish green body color and when it was excited by black light, a weak yellowish green emission was observed.

COMPARATIVE EXAMPLE 6

94.27 g of $SrCO_3$ powder, 7.12 g of $BaCO_3$ powder, 22.835 g of $SiO_2$ powder and 4.460 g of $Eu_2O_3$ powder were prepared as starting materials. To these starting materials, 1.8 g of $NH_4Cl$ was added as a crystal growth-promoting agent. Then, these starting materials were mixed together in a ball mill.

The mixed raw materials thus obtained were charged into a sintering vessel and sintered under the following sintering conditions. First of all, the mixed raw materials were sintered for 3-7 hours in a reducing atmosphere of nitrogen/hydrogen at a temperature ranging from 1000 to 1600° C. to prepare an $Sr_{1.9}Ba_{0.1}SiO_4$:Eu luminescent material of this comparative example. The luminescent material thus sintered was formed of a sintered body having a yellow body color and when it was excited by black light, a yellow emission was observed.

The luminescent materials of Comparative Examples 3-5 were respectively chemically analyzed, the results being summarized in the following Table 8. In this Table 6, there are shown the values of "a", "b", "c" and "d" in the aforementioned general formula (B).

TABLE 8

|  | a | b | c | d |
| --- | --- | --- | --- | --- |
| Comp. Ex. 3 | 0.68 | 2.59 | 1.12 | 3.78 |
| Comp. Ex. 4 | 0.95 | 4.25 | 1.68 | 5.59 |
| Comp. Ex. 5 | 0.99 | 5.03 | 1.75 | 6.48 |

Although the luminescent materials of Comparative Examples 3-5 all comprise, as a matrix, a sialon-based compound, they fail to meet any of the conditions defined by the general formulas (1), (2) and (3). Therefore, it will be seen that these luminescent materials were all falling outside the scope of composition of luminescent material as defined by the embodiment of the present invention. It should be noted that the luminescent materials of Comparative Examples 1, 2 and 6 were all different from those comprising a sialon-based compound as a matrix.

The luminescent materials of Comparative Examples 3-5 were subjected to X-ray diffraction measurement employing CuKα characteristic X-rays (wavelength: 1.54056 Å), the results being illustrated in FIG. 21. In this FIG. 21, the results of X-ray diffraction measurement performed on the luminescent materials of Reference Example 20 and of Example 2 are also illustrated. As shown in FIG. 21, since the compositions of the luminescent materials of Comparative Examples 3-5 were not confined within the aforementioned prescribed range, the luminescent materials of Comparative Examples 3-5 exhibited XRD profiles which were different from that of Reference Example 20 or of Example 2. For this reason, the luminescent materials of Comparative Examples 3-5 were supposed that they were respectively formed of a different structure from that of the luminescent material of Example 2. The structure of each of the luminescent materials of Comparative Examples 3-5 was almost identical with the pattern of S phase (JCPDS card #53-0636) shown in FIG. 21.

The luminescent materials of Comparative Examples 3-5 were respectively excited by an emission diode exhibiting a peak wavelength of 390 nm. The emission spectrums thus obtained are shown in FIG. 22. FIG. 22 also shows the results obtained from the red powder of Reference Example 20 and from the yellowish green powder of Example 2. In FIG. 22, the bands each exhibiting a peak at 390 nm were derived from the reflection of exciting beam. The luminescent materials of Comparative Examples 3-5 were all very low in emission intensity.

As seen from the results described above, any kinds of luminescent material whose compositions fall outside the composition range of luminescent material as defined by this embodiment would have a different structure from those of the luminescent materials of this embodiment, thus failing to obtain desired emission characteristics.

The red powders of Reference Examples 20 and 39 were excited while increasing the temperature of these samples from room temperature to 200° C. by a heater to measure any changes in emission spectrum. In this excitation, an emission diode exhibiting a peak wavelength of 458 nm was employed. FIG. 23 shows the temperature dependency of the peak emission intensity in emission spectrum at each temperature.

For the purpose of comparison, the temperature dependency of the peak emission intensity of $Sr_2Si_5N_8$:Eu luminescent material of Comparative Example 1 and the temperature dependency of CaS:Eu luminescent material of Comparative Example 2 are also shown in FIG. 23. The y-axis in FIG. 23 represents values which were normalized on the basis of emission intensity of each of luminescent materials at room temperature, the value of which being set to one.

The graph of FIG. 23 indicates that, in the cases of luminescent materials of Reference Examples 20 and 39, even under high temperature conditions of as high as 200° C., the deterioration of emission intensity thereof was minimal. It will be recognized from these results that the luminescent material according to this embodiment was excellent in temperature characteristics as compared with CaS:Eu luminescent material and also with $Sr_2Si_5N_8$:Eu luminescent material which was constituted by the same nitride matrix as that of the luminescent material of this embodiment. In the graph of FIG. 23, only the results obtained from the luminescent materials of Reference Examples 20 and 39 are shown. However, even in the cases of luminescent materials of other examples, it was also possible to obtain more excellent temperature characteristics than those of comparative examples.

In the same manner as described above, the red powders of Comparative Examples 3 to 5 were also excited while increasing the temperature of these samples to measure any changes in emission spectrum. As a result, under high temperature conditions of as high as 20° C., all of these luminescent materials were deteriorated in emission intensity, thus indicating almost the same tendency as that of Comparative Example 1 or Comparative Example 2.

Further, the yellowish green powder of Example 1 was excited while increasing the temperature of this sample from room temperature to 200° C. by a heater to measure any changes in emission spectrum. In this excitation, an emission diode exhibiting a peak wavelength of 458 nm was employed.

FIG. 24 shows the temperature dependency of the peak emission intensity in emission spectrum at each temperature.

For the purpose of comparison, the temperature dependency of the peak emission intensity of $Sr_{1.9}Ba_{0.1}SiO_4$:Eu luminescent material of Comparative Example 6 is also shown in FIG. 24. The y-axis in FIG. 24 represents values which were normalized on the basis of emission intensity of each of luminescent materials at room temperature, the value of which being set to one.

The graph of FIG. 24 indicates that the luminescent material of Example 1 was minimal in deterioration of emission intensity even under high temperature condition of as high as 200° C. It will be recognized from the result thus obtained that the luminescent material of this embodiment was excellent in temperature characteristics as compared with $Sr_{1.9}Ba_{0.1}SiO_4$:Eu luminescent material.

Further, using the luminescent material of Example 1, a light-emitting device was manufactured as shown in FIG. 2. When the light-emitting device thus obtained was actuated at a temperature ranging from room temperature to 150° C. to measure the changes in emission efficiency with temperature, almost no deterioration in emission efficiency was caused to occur within this range of temperature. From this fact, it was confirmed that the light-emitting device according to this embodiment was provided with excellent temperature characteristics.

When the luminescent material of Comparative Example 3 was employed to manufacture a light-emitting device which was similar in structure as described above and the light-emitting device was tested in the same manner as described above. As a result, the emission efficiency thereof was prominently deteriorated in the aforementioned range of temperature. Even when the luminescent materials of Comparative Examples 4 and 5 were employed, almost the same result as that of the luminescent material of Comparative Example 3 was obtained. It was confirmed that even in the case of sialon-based compounds comprising an emission center element, it was impossible to secure excellent temperature characteristics unless the composition thereof was not confined to fall within the aforementioned prescribed range.

According to the present invention, it is possible to provide a luminescent material excellent in temperature characteristics and a light-emitting device wherein this luminescent material is employed.

What is claimed is:

1. A luminescent material, wherein said luminescent material exhibits a light emission peak in a wavelength ranging from 490 to 580 nm when excited with light having a wavelength ranging from 250 to 500 nm and has a composition represented by the following general formula (2):

$$(M_{1-x}R_x)_{a2}AlSi_{b2}O_{c2}N_{d2} \quad (2)$$

wherein in the general formula (2), M comprises Sr; R comprises Eu; and x, a2, b2, c2 and d2 satisfy the following relationships:
$0<x\leq1$, $0.93<a2<1.3$, $4.0<b2<5.8$
$0.6<c2<1$, and $6<d2<11$,
wherein the luminescent material comprises one component concurrently indicating diffraction peaks at diffraction angles (2θ) of 11.81-11.85, 15.34-15.38, 20.40-20.47 and 23.74-23.86° in the X-ray diffraction in the presence of CuKα characteristic X-rays having a wavelength of 1.54056 Å.

2. The luminescent material according to claim 1, wherein in the general formula (2)
a2, b2, c2 and d2 satisfy the following relationships:
$0.94<a2<1.1$, $4.1<b2<4.7$, $0.7<c2<0.85$, $7<d2<9$.

3. The luminescent material according to claim 1, wherein M comprises Sr and further comprises at least one element selected from a group consisting of Mg, Ca, Ba, Y, Gd, La, Lu, Sc, Li, Na, K, B, Ga, In and Ge.

4. The luminescent material according to claim 1, wherein M comprises Sr and further comprises at least one element selected from a group consisting of Mg, Ca, and Ba.

5. The luminescent material according to claim 1, wherein R comprises Eu and further comprises at least one element selected from a group consisting of Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi and Fe.

6. The luminescent material according to claim 1, wherein x in the general formula (2) is 0.001 or more.

7. The luminescent material according to claim 1, wherein x in the general formula (2) is 0.5 or less.

* * * * *